(12) United States Patent
Tarnowski et al.

(10) Patent No.: US 7,494,742 B2
(45) Date of Patent: Feb. 24, 2009

(54) LAYERED BARRIER STRUCTURE HAVING ONE OR MORE DEFINABLE LAYERS AND METHOD

(75) Inventors: Dave J. Tarnowski, Shoreview, MN (US); Mark L. Jenson, Zimmerman, MN (US)

(73) Assignee: Cymbet Corporation, Elk River, MN (US)

( * ) Notice: Subject to any disclaimer, the term of this patent is extended or adjusted under 35 U.S.C. 154(b) by 401 days.

(21) Appl. No.: 11/031,217

(22) Filed: Jan. 6, 2005

(65) Prior Publication Data

US 2005/0147877 A1 Jul. 7, 2005

Related U.S. Application Data

(60) Provisional application No. 60/534,660, filed on Jan. 6, 2004.

(51) Int. Cl.
*H01M 6/12* (2006.01)
(52) U.S. Cl. .................. 429/162; 429/163; 429/185
(58) Field of Classification Search ............... 429/171, 429/185, 162, 163, 177
See application file for complete search history.

(56) References Cited

U.S. PATENT DOCUMENTS

| | | | |
|---|---|---|---|
| 3,419,487 A | 12/1968 | Robbins et al. | |
| 4,207,119 A | 6/1980 | Tyan | |
| 4,299,890 A | 11/1981 | Rea et al. | |
| 4,328,262 A | 5/1982 | Kurahashi et al. | |
| 4,333,808 A | 6/1982 | Bhattacharyya et al. | |
| 4,353,160 A | 10/1982 | Armini et al. | |
| 4,365,107 A | 12/1982 | Yamauchi | |
| 4,435,445 A | 3/1984 | Allred et al. | |
| 4,440,108 A | 4/1984 | Little et al. | |

(Continued)

FOREIGN PATENT DOCUMENTS

EP 0643544 8/1994

(Continued)

OTHER PUBLICATIONS

Aramoto, T., et al., "16.0% Effecient Thin-Film CdS/CdTe Solar Cells", *Jpn. J. Appl. Phys.*, vol. 36, Pt. 1, No. 10, (1997),6304-6305.

(Continued)

*Primary Examiner*—Patrick Ryan
*Assistant Examiner*—Ben Lewis
(74) *Attorney, Agent, or Firm*—Charles A. Lemaire; Lemaire Patent Law Firm, P.L.L.C.

(57) ABSTRACT

A system provides an environmental barrier also useful for providing a circuit, for example, one having a thin-film battery such as one that includes lithium or lithium compounds connected to an electronic circuit. An environmental barrier is deposited as alternating layers, at least one of the layers providing a smoothing, planarizing, and/or leveling physical-configuration function, and at least one other layer providing a diffusion-barrier function. The layer providing the physical-configuration function may include a photoresist, a photodefinable, an energy-definable, and/or a maskable layer. The physical-configuration layer may also be a dielectric. A layered structure, including a plurality of pairs of layers, each pair including a physical configuration layer and a barrier layer with low gas-transmission rates, may be used in reducing gas transmission rate to beyond currently detectable levels.

77 Claims, 19 Drawing Sheets

U.S. PATENT DOCUMENTS

| | | | |
|---|---|---|---|
| 4,481,265 A | 11/1984 | Ezawa et al. | |
| 4,520,039 A | 5/1985 | Ovshinsky | |
| 4,539,660 A | 9/1985 | Miyauchi et al. | |
| 4,633,129 A | 12/1986 | Cuomo et al. | |
| 4,645,726 A | 2/1987 | Hiratani et al. | |
| 4,684,848 A | 8/1987 | Kaufman et al. | |
| 4,696,671 A | 9/1987 | Epstein et al. | |
| 4,730,383 A | 3/1988 | Balkanski | |
| 4,740,431 A | 4/1988 | Little | |
| 4,798,574 A | 1/1989 | Marsik | |
| 4,832,463 A | 5/1989 | Goldner et al. | |
| 4,862,032 A | 8/1989 | Kaufman et al. | |
| 5,017,550 A | 5/1991 | Shioya et al. | |
| 5,022,930 A | 6/1991 | Ackerman et al. | |
| 5,051,274 A | 9/1991 | Goldner et al. | |
| 5,064,520 A | 11/1991 | Miyake et al. | |
| 5,089,104 A | 2/1992 | Kanda et al. | |
| 5,098,737 A | 3/1992 | Collins et al. | |
| 5,115,378 A | 5/1992 | Tsuchiya et al. | |
| 5,126,031 A | 6/1992 | Gordon et al. | |
| 5,151,848 A | 9/1992 | Finello | |
| 5,166,009 A | 11/1992 | Abraham et al. | |
| 5,171,413 A | 12/1992 | Arntz et al. | |
| 5,180,645 A | 1/1993 | More | |
| 5,189,550 A | 2/1993 | Goldner et al. | |
| 5,192,947 A | 3/1993 | Neustein | |
| 5,202,196 A | 4/1993 | Wang et al. | |
| 5,202,201 A | 4/1993 | Meunier et al. | |
| 5,261,968 A | 11/1993 | Jordan | |
| 5,273,837 A | 12/1993 | Aitken et al. | |
| 5,296,122 A | 3/1994 | Katsube et al. | |
| 5,314,765 A | 5/1994 | Bates | |
| 5,338,625 A | 8/1994 | Bates et al. | |
| 5,348,703 A | 9/1994 | Bishop et al. | |
| 5,393,572 A | 2/1995 | Dearnaley | |
| 5,411,592 A | 5/1995 | Ovshinsky et al. | |
| 5,415,717 A | 5/1995 | Perneborn | |
| 5,425,966 A | 6/1995 | Winter et al. | |
| 5,426,561 A | 6/1995 | Yen et al. | |
| 5,433,096 A | 7/1995 | Janssen et al. | |
| 5,445,126 A | 8/1995 | Graves, Jr. | |
| 5,445,906 A | 8/1995 | Hobson et al. | |
| 5,448,110 A | 9/1995 | Tuttle et al. | |
| 5,449,994 A | 9/1995 | Armand et al. | |
| 5,455,126 A | 10/1995 | Bates et al. | |
| 5,468,521 A | 11/1995 | Kanai et al. | |
| 5,482,611 A | 1/1996 | Helmer et al. | |
| 5,494,762 A | 2/1996 | Isoyama et al. | |
| 5,501,175 A | 3/1996 | Tanaka et al. | |
| 5,501,924 A | 3/1996 | Swierbut et al. | |
| 5,510,209 A | 4/1996 | Abraham et al. | |
| 5,512,147 A | 4/1996 | Bates et al. | |
| 5,523,179 A | 6/1996 | Chu | |
| 5,528,222 A | 6/1996 | Moskowitz et al. | |
| 5,529,671 A | 6/1996 | Debley et al. | |
| 5,536,333 A | 7/1996 | Foote et al. | |
| 5,549,989 A | 8/1996 | Anani | |
| 5,558,953 A | 9/1996 | Matsui et al. | |
| 5,561,004 A | 10/1996 | Bates et al. | |
| 5,567,210 A | 10/1996 | Bates et al. | |
| 5,569,520 A | 10/1996 | Bates | |
| 5,569,564 A | 10/1996 | Swierbut et al. | |
| 5,571,749 A | 11/1996 | Matsuda et al. | |
| 5,582,623 A | 12/1996 | Chu | |
| 5,585,999 A | 12/1996 | De Long et al. | |
| 5,593,551 A | 1/1997 | Lai | |
| 5,597,660 A | 1/1997 | Bates et al. | |
| 5,599,644 A | 2/1997 | Swierbut et al. | |
| 5,601,652 A | 2/1997 | Mullin et al. | |
| 5,612,152 A | 3/1997 | Bates | |
| 5,626,976 A | 5/1997 | Blanton et al. | |
| 5,644,207 A | 7/1997 | Lew et al. | |
| 5,654,084 A | 8/1997 | Egert | |
| 5,654,111 A | 8/1997 | Minomiya et al. | |
| 5,686,201 A | 11/1997 | Chu | |
| 5,695,873 A | 12/1997 | Kumar et al. | |
| 5,695,885 A | 12/1997 | Malhi | |
| 5,705,293 A | 1/1998 | Hobson | |
| 5,714,404 A | 2/1998 | Mitlitsky et al. | |
| 5,763,058 A | 6/1998 | Isen et al. | |
| 5,789,108 A | 8/1998 | Chu | |
| 5,814,420 A | 9/1998 | Chu | |
| 5,830,331 A | 11/1998 | Kim et al. | |
| 5,849,426 A | 12/1998 | Thomas et al. | |
| 5,863,337 A | 1/1999 | Neuman et al. | |
| 5,868,914 A | 2/1999 | Landsbergen et al. | |
| 5,872,080 A | 2/1999 | Arendt et al. | |
| 5,914,507 A | 6/1999 | Polla et al. | |
| 5,925,483 A | 7/1999 | Kejha et al. | |
| 5,932,284 A | 8/1999 | Reynolds | |
| 5,935,727 A | 8/1999 | Chiao | |
| 5,953,677 A | 9/1999 | Sato | |
| 5,978,207 A | 11/1999 | Anderson et al. | |
| 5,981,107 A | 11/1999 | Hamano et al. | |
| 5,982,284 A | 11/1999 | Baldwin et al. | |
| 5,995,006 A | 11/1999 | Walsh | |
| 6,001,715 A | 12/1999 | Manka et al. | |
| 6,002,208 A | 12/1999 | Maishev et al. | |
| 6,023,610 A | 2/2000 | Wood, Jr. | |
| 6,025,094 A | 2/2000 | Visco et al. | |
| 6,033,471 A | 3/2000 | Nakanishi et al. | |
| 6,037,717 A | 3/2000 | Maishev et al. | |
| 6,042,687 A | 3/2000 | Singh et al. | |
| 6,056,857 A | 5/2000 | Hunt et al. | |
| 6,059,847 A | 5/2000 | Farahmandi et al. | |
| 6,077,621 A | 6/2000 | Allen et al. | |
| 6,078,791 A | 6/2000 | Tuttle et al. | |
| 6,086,962 A | 7/2000 | Mahoney et al. | |
| 6,094,292 A | 7/2000 | Goldner et al. | |
| 6,103,412 A | 8/2000 | Hirano et al. | |
| 6,110,620 A | 8/2000 | Singh et al. | |
| 6,130,507 A | 10/2000 | Maishev et al. | |
| 6,133,159 A | 10/2000 | Vaartstra et al. | |
| 6,136,165 A | 10/2000 | Moslehi | |
| 6,139,964 A | 10/2000 | Sathrum et al. | |
| 6,147,354 A | 11/2000 | Maishev et al. | |
| 6,153,067 A | 11/2000 | Maishev et al. | |
| 6,163,260 A | 12/2000 | Conwell et al. | |
| 6,168,884 B1 | 1/2001 | Neudecker et al. | |
| 6,175,196 B1 | 1/2001 | Ragner et al. | |
| 6,181,237 B1 | 1/2001 | Gehlot | |
| 6,181,545 B1 | 1/2001 | Amatucci et al. | |
| 6,203,944 B1 | 3/2001 | Turner et al. | |
| 6,220,516 B1 * | 4/2001 | Tuttle et al. | 235/492 |
| 6,222,117 B1 | 4/2001 | Shiozaki | |
| 6,236,061 B1 | 5/2001 | Walpita | |
| 6,238,813 B1 | 5/2001 | Maile et al. | |
| 6,264,709 B1 | 7/2001 | Yoon et al. | |
| 6,277,523 B1 | 8/2001 | Giron | |
| 6,280,875 B1 | 8/2001 | Kwak et al. | |
| 6,281,795 B1 | 8/2001 | Smith et al. | |
| 6,294,722 B1 | 9/2001 | Kondo et al. | |
| 6,325,294 B2 | 12/2001 | Tuttle et al. | |
| 6,327,909 B1 | 12/2001 | Hung et al. | |
| 6,391,664 B1 | 5/2002 | Goruganthu et al. | |
| 6,399,489 B1 * | 6/2002 | M'Saad et al. | 438/680 |
| 6,402,795 B1 | 6/2002 | Chu et al. | |
| 6,402,796 B1 | 6/2002 | Johnson | |
| 6,413,675 B1 | 7/2002 | Harada et al. | |
| 6,432,577 B1 | 8/2002 | Shul et al. | |
| 6,475,854 B2 | 11/2002 | Narwankar et al. | |
| 6,555,836 B1 * | 4/2003 | Takahashi et al. | 250/559.19 |
| 6,558,836 B1 * | 5/2003 | Whitacre et al. | 429/162 |
| 6,576,365 B1 | 6/2003 | Meitav et al. | |

| | | | |
|---|---|---|---|
| 6,576,369 B1 | 6/2003 | Moriguchi et al. | |
| 6,599,580 B2 | 7/2003 | Muffoletto et al. | |
| 6,608,464 B1 | 8/2003 | Lew et al. | |
| 6,610,971 B1 | 8/2003 | Crabtree | |
| 6,619,123 B2 | 9/2003 | Gianchandani et al. | |
| 6,634,232 B1 | 10/2003 | Rettig et al. | |
| 6,645,656 B1 | 11/2003 | Chen et al. | |
| 6,723,140 B2 | 4/2004 | Chu et al. | |
| 6,741,178 B1 | 5/2004 | Tuttle | |
| 6,805,998 B2 | 10/2004 | Jenson et al. | |
| 6,818,356 B1 | 11/2004 | Bates | |
| 6,821,348 B2 | 11/2004 | Baude et al. | |
| 6,866,901 B2 * | 3/2005 | Burrows et al. | 428/1.5 |
| 6,897,164 B2 | 5/2005 | Baude et al. | |
| 6,906,436 B2 | 6/2005 | Jenson et al. | |
| 6,924,164 B2 | 8/2005 | Jenson | |
| 6,982,132 B1 | 1/2006 | Goldner et al. | |
| 6,986,965 B2 | 1/2006 | Jenson et al. | |
| 6,989,750 B2 | 1/2006 | Shanks et al. | |
| 7,028,547 B2 | 4/2006 | Shiratori et al. | |
| 2001/0014398 A1 | 8/2001 | Veerasamy | |
| 2001/0033952 A1 | 10/2001 | Jensen et al. | |
| 2001/0043569 A1 | 11/2001 | Wood, Jr. | |
| 2001/0051300 A1 | 12/2001 | Moriguchi et al. | |
| 2002/0000034 A1 | 1/2002 | Jenson et al. | |
| 2002/0037756 A1 * | 3/2002 | Jacobs et al. | 455/572 |
| 2002/0076616 A1 | 6/2002 | Lee et al. | |
| 2002/0110733 A1 | 8/2002 | Johnson | |
| 2002/0184949 A1 | 12/2002 | Gianchandani et al. | |
| 2003/0104590 A1 * | 6/2003 | Santini et al. | 435/174 |
| 2003/0151118 A1 | 8/2003 | Baude et al. | |
| 2003/0171984 A1 | 9/2003 | Wodka et al. | |
| 2004/0077383 A1 | 4/2004 | Lappetelainen et al. | |
| 2004/0094949 A1 | 5/2004 | Savagian et al. | |
| 2004/0131760 A1 | 7/2004 | Shakespeare | |
| 2004/0131761 A1 | 7/2004 | Shakespeare | |
| 2004/0131897 A1 | 7/2004 | Jenson et al. | |
| 2005/0019666 A1 | 1/2005 | Yasuda | |
| 2005/0079418 A1 | 4/2005 | Kelley et al. | |
| 2005/0095506 A1 | 5/2005 | Klaassen | |
| 2005/0199282 A1 | 9/2005 | Oleinick et al. | |

FOREIGN PATENT DOCUMENTS

| | | |
|---|---|---|
| EP | 0860888 | 8/1998 |
| EP | 0867752 | 9/1998 |
| EP | 1 041 657 A2 | 10/2000 |
| GB | 2 318 127 A | 4/1998 |
| GB | 2318127 | 4/1998 |
| JP | 58126679 | 7/1983 |
| JP | 57230095 | 7/1984 |
| JP | 59123236 | 7/1984 |
| JP | 60012679 | 1/1985 |
| JP | 60182961 | 2/1987 |
| JP | 62044960 | 2/1987 |
| JP | 63166151 | 1/1990 |
| JP | 03205757 | 9/1991 |
| JP | 03262697 | 11/1991 |
| JP | 06067018 | 3/1994 |
| JP | 6111828 | 4/1994 |
| JP | 6196178 | 7/1994 |
| JP | 06223805 | 8/1994 |
| JP | 07006933 | 1/1995 |
| JP | 07-050229 | 2/1995 |
| JP | 07057739 | 3/1995 |
| JP | 08017179 | 1/1996 |
| JP | 08293310 | 5/1996 |
| JP | 08236105 | 9/1996 |
| JP | 08287901 | 11/1996 |
| JP | 08329983 | 12/1996 |
| JP | 09035233 | 2/1997 |
| JP | 09211204 | 8/1997 |
| JP | 10021896 | 1/1998 |
| JP | 10021933 | 1/1998 |
| JP | 2000188113 | 7/2000 |
| WO | WO-99/331240 | 7/1990 |
| WO | WO-92/15140 | 9/1992 |
| WO | WO-92/16025 | 9/1992 |
| WO | WO-92/19090 | 10/1992 |
| WO | WO-93/14612 | 7/1993 |
| WO | WO-95/14311 | 5/1995 |
| WO | WO-97/38453 | 10/1997 |
| WO | WO-97/39491 | 10/1997 |
| WO | WO-98/13743 | 4/1998 |
| WO | WO-98/47196 | 10/1998 |
| WO | WO-99/25908 | 5/1999 |

OTHER PUBLICATIONS

Birkmire, R. W., et al., "Polycrystalline Thin Film Solar Cells: Present Status and Future Potential", *Annu. Rev. Mater. Sci.*, 27, (1997),pp. 625-653.

Chu, T. L., et al., "13.4% efficient thin-film CdS/CdTe solar cells", *J. Appl. Phys.*, 70(12), (Dec. 15, 1991),pp. 7608-7612.

Dobley, Arthur, et al., "High Capacity Cathodes for Lithium-Air Batteries", Yardney Technical Products, Inc./Lithion, Inc. Pawcatuck, CT <http://www2.electrochem.org/cgi-bin/abs?mtg=206&abs=0496>.

Dudney, N. J., et al., "Nanocrystalline LixMn2-yO4 Cathodes for Solid-State Thin-Film Rechargeable Lithium Batteries", *Journal of the Electrochemical Society*, 146(7), (1999),pp. 2455-2464.

Dunn, D., et al., "MoS2 Deposited by ion beam assisted deposition: 2H or random layer structure.", *Naval Research Laboratory*, (1998),pp. 3001-3007.

Goldner, R., et al., "ambient Temperature Synthesis of Polycrystalline Thin Films of Lithium Cobalt Oxide with Controlled Crystallites Orientations", *Electrochemical Soc. Proceedings*, 98, (1999),268-273.

Goldner, R., et al., "Ambient Temperature Synthesis of Polycrystalline Thin Films of Lithium Cobalt Oxide with Controlled Crystallites' Orientation", *Mat. Res. Soc. Symp. Proc.*, 548, (1998),pp. 131-136.

Jacobson, A. J., "intercalation Chemistry", *In: Encyclopedia of Inorganic Chemisty*, vol. 3, (1994),pp. 1556-1602.

Kyokane, J., et al., "Organic Solid Capacitor with Conducting Thin Films as Electrolyte by Ion-Beam-Assisted Deposition", *Journal of Power Sources*, 60, (1996),pp. 151-155.

Liu, W., et al., "Deposition, Structural Characterization, and Broadband (1KHz-40GHz) Dielectri Behavior of BaxTi2-xOy Thin Films", *Mat. Res. Soc. Symp. Proc.*, 310, (1993),pp. 157-162.

Lugscheider, E., et al., "Comparison of the Structure of PVD-Thin Films Deposited With Different Deposition Energies", *Surface and Coatings Technology*, 86-87 (1-3), (Dec. 1, 1996),177-183.

Martin, P. J., et al., "Modification of the Optical and Structural Properties of Dielectric ZrO2 Films by Ion-assisted Deposition", *Journal of Applied Physics*, 55, (1984),235-241.

McKenzie, D. R., et al., "New Technology for PACVD", *Surface and Coatings Technology*, 82 (3), (1996),326-333.

Nomoto, S., et al., "Back-up Performance of Electric Double-Layer Capacitors for Rechargeable Batteries", *Electrochemical Society Proceedings*, (1997),268-279.

Shodai, T, et al., "Reaction Mechanisms of Li(2.6)Co(0.4) Anode Material", *Solid State Ionics*, (1999),85-93.

Shukla, A. K., et al., "Electrochemical supercapacitors: Energy storage beyond batteries", *Current Science*, vol. 79, No. 12, (Dec. 25, 2000), 1656-1661.

Vereda, F., et al., "A Study of Electronic Shorting in IBDA-deposited Lipon Films", *Journal of Power Sources*, 89, (2000),201-205.

Yoshida, T., "Photovoltaic Properties of Screen-Printed CdTe/CdS Solar Cells on Indium-Tin-Oxide Coated Glass Substrates", *J. Electrochem. Soc.*, 142 (9), (Sep. 1995),pp. 3232-3237.

Zeitler, M., et al., "in Situ Stress Analysis of Boron Nitride Films Prepared by Ion Beam Assisted Deposition", *Nuclear Instruments and Methods in Physics Research B*, 139, (1998),pp. 327-331.

Abraham, K.M., et al, "A Polymer Electrolyte-Based Rechargeable Lithium/Oxygen Battery", 1996, pp. 1-5, vol. 143, Publisher: Journal of the Electrochemical Society.

Dudney, Nancy J.., "Addition of a thin-film inorganic solid electrolyte (Lipon) as a protective film in lithium batteries with a liquid elect", "Journal of Power Sources", 2000, pp. 176-179, vol. 89.

Read, J, "Characterization of the Lithium/Oxygen Organic Electrolyte Battery", "Journal of the Electrochemical Society", 2002, pp. A1190-A1195, vol. 149.

Dobley, Arthur, et al., "High Capacity Cathodes for Lithium-Air Batteries", Yardney Technical Products, Inc./Lithion, Inc. Pawcatuck, CT Electrochemical Society Conference, (May 20, 2004).

Dobley, Arthur, et al., "Non-aqueous Lithium-Air Batteries with an Advanced Cathode Structure", Yardley Technical Products, Inc./Lithion, Inc. Pawcatuck, CT 41st Power Sources Conference Proceedings, Philadelphia, PA, (Dec. 10, 2003).

* cited by examiner

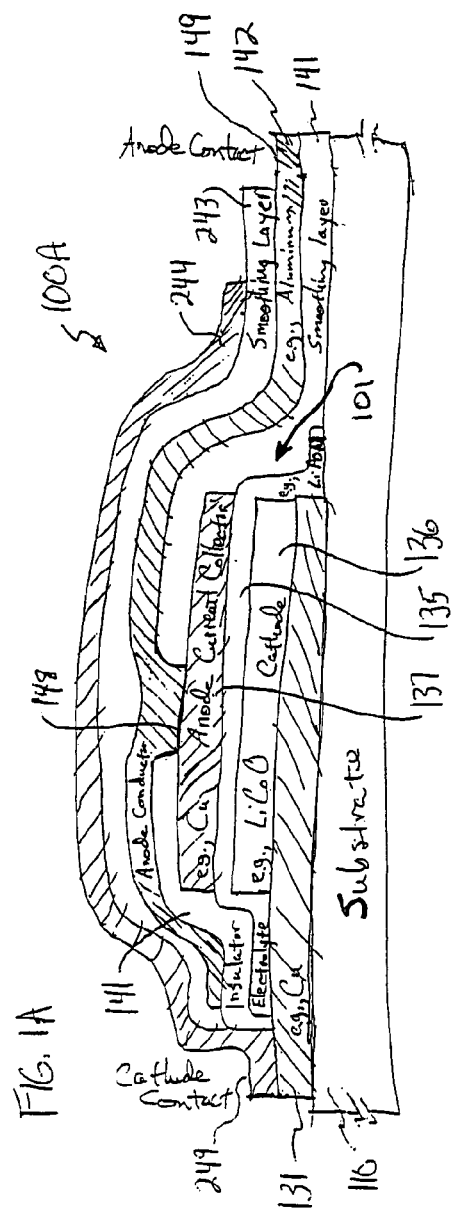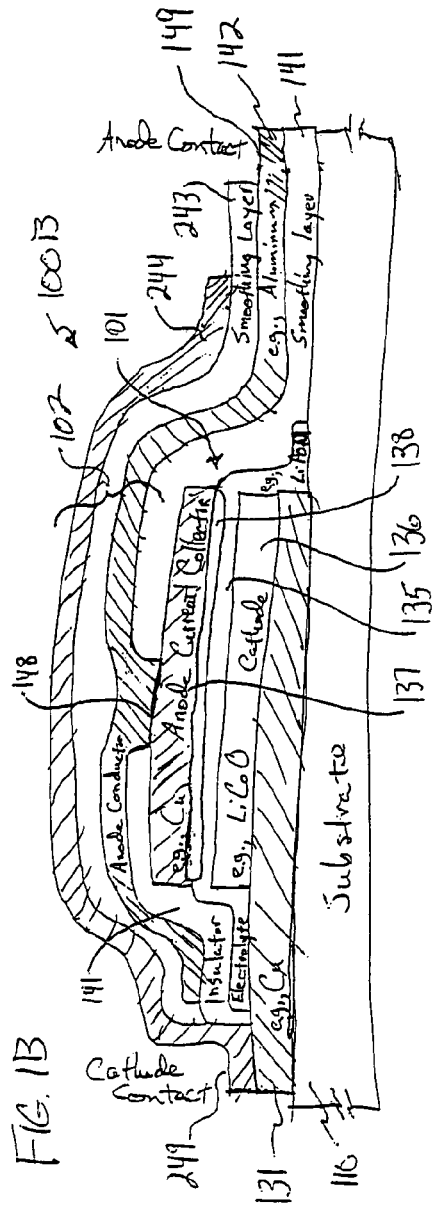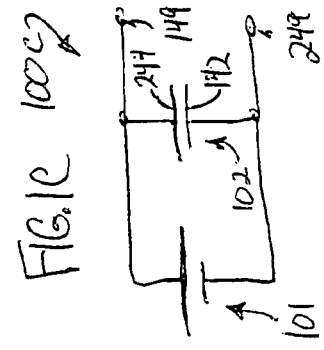

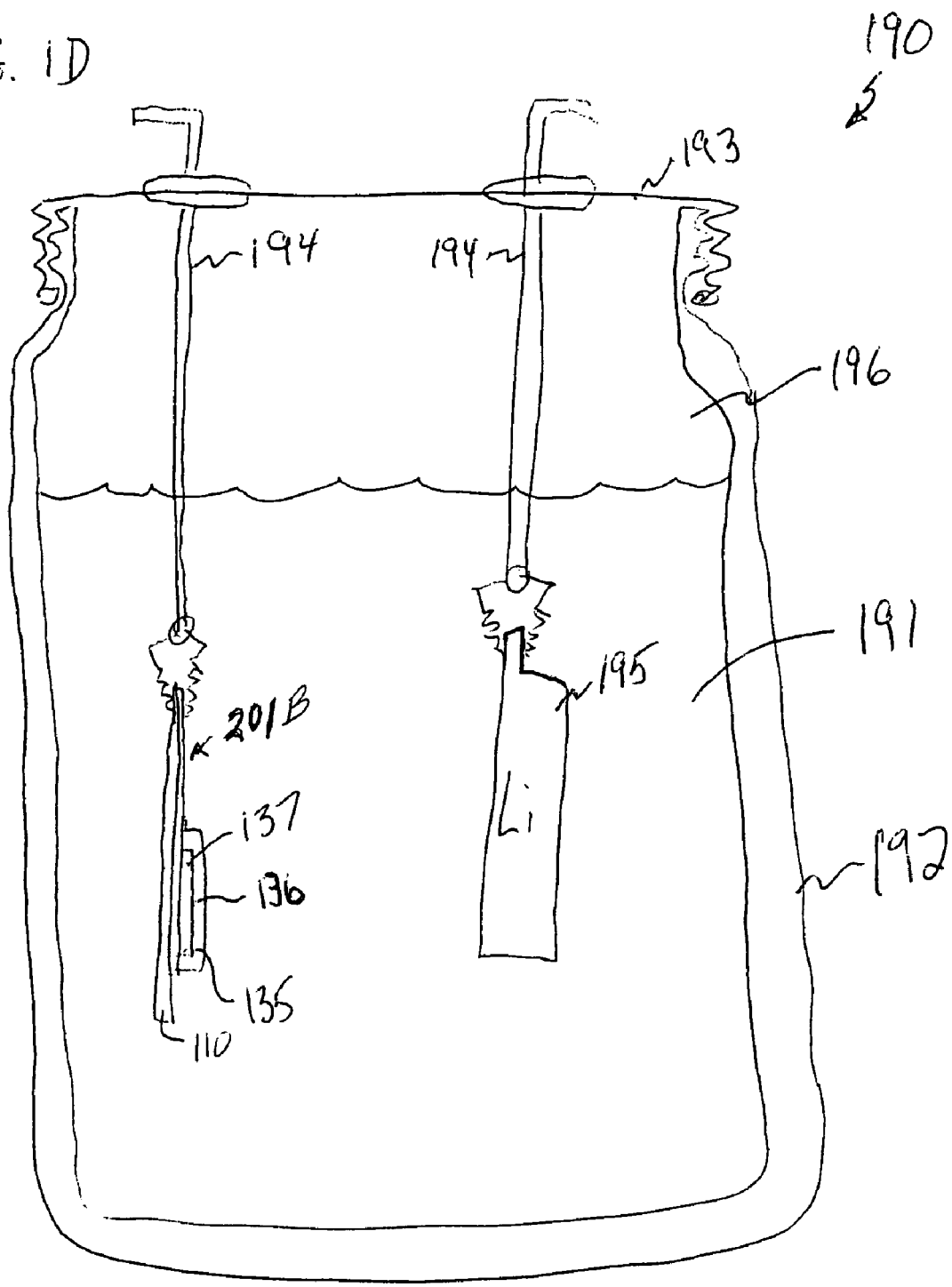

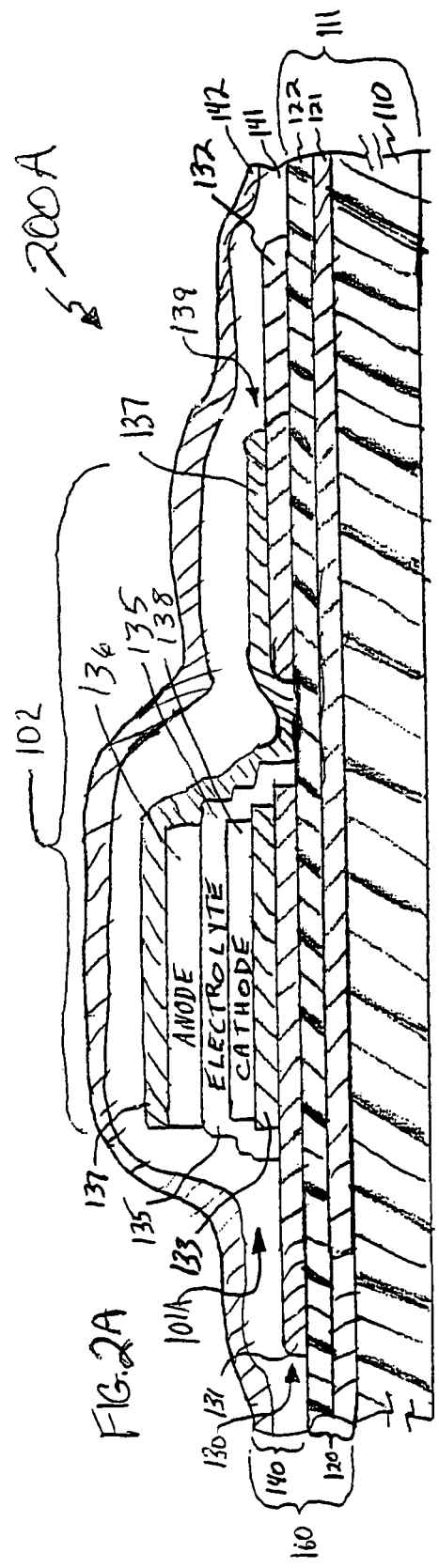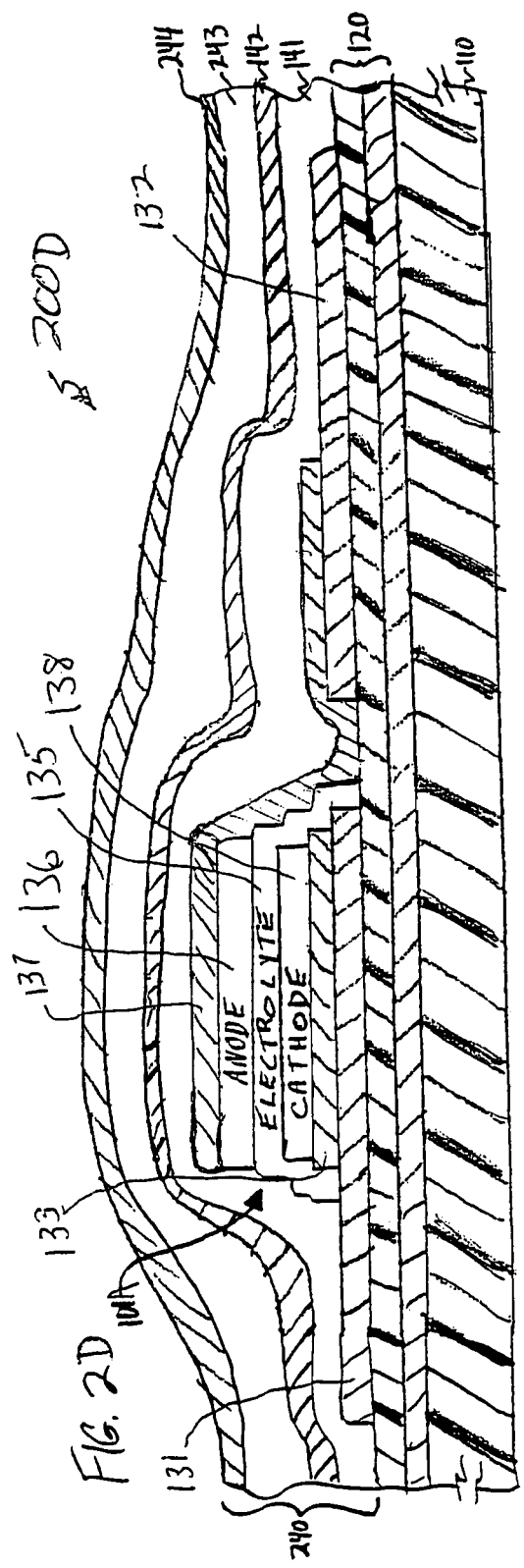

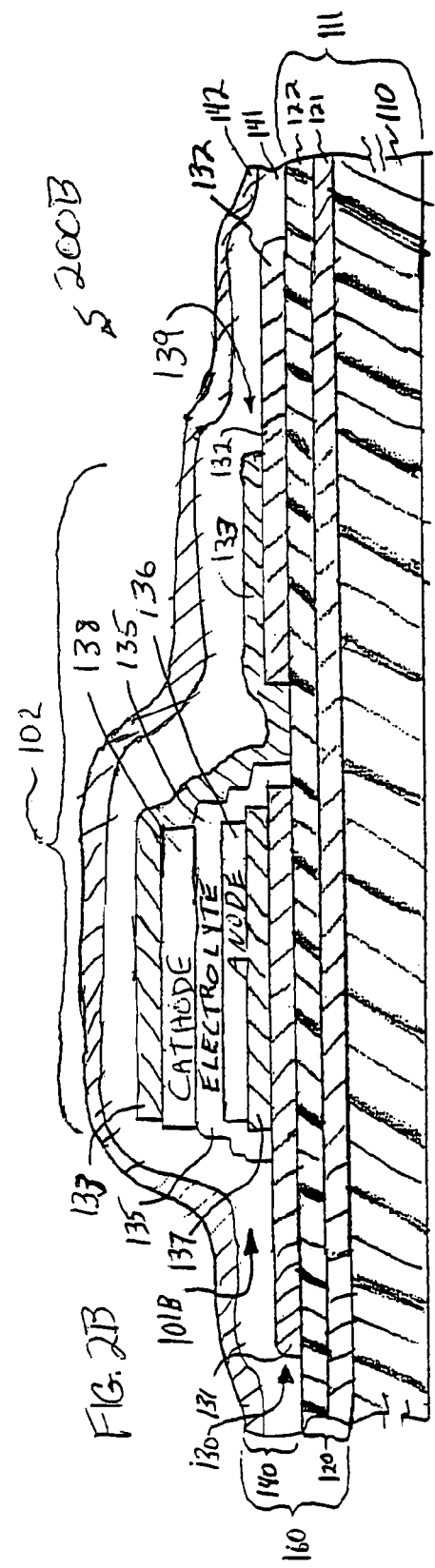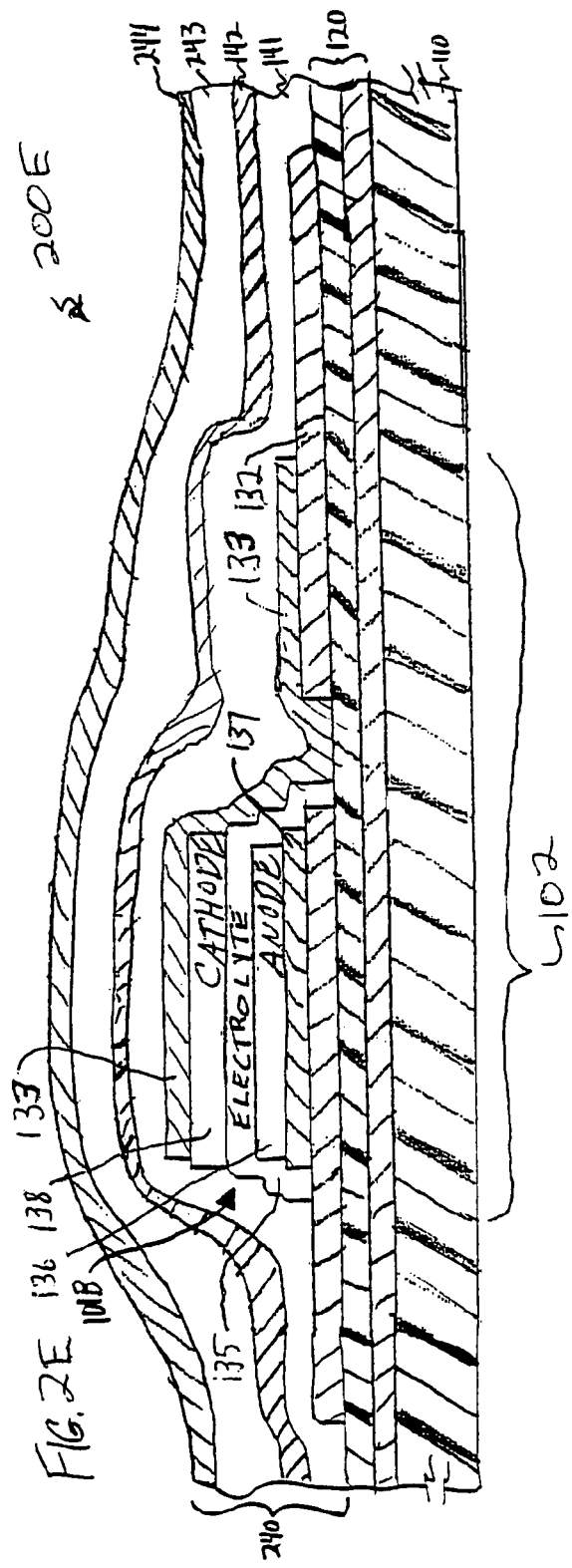

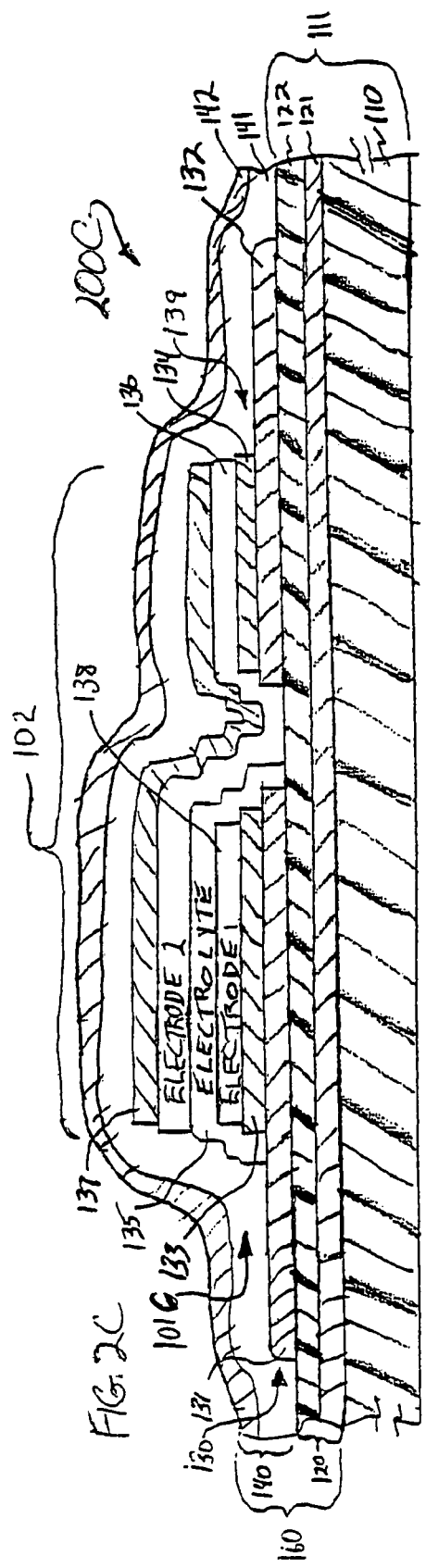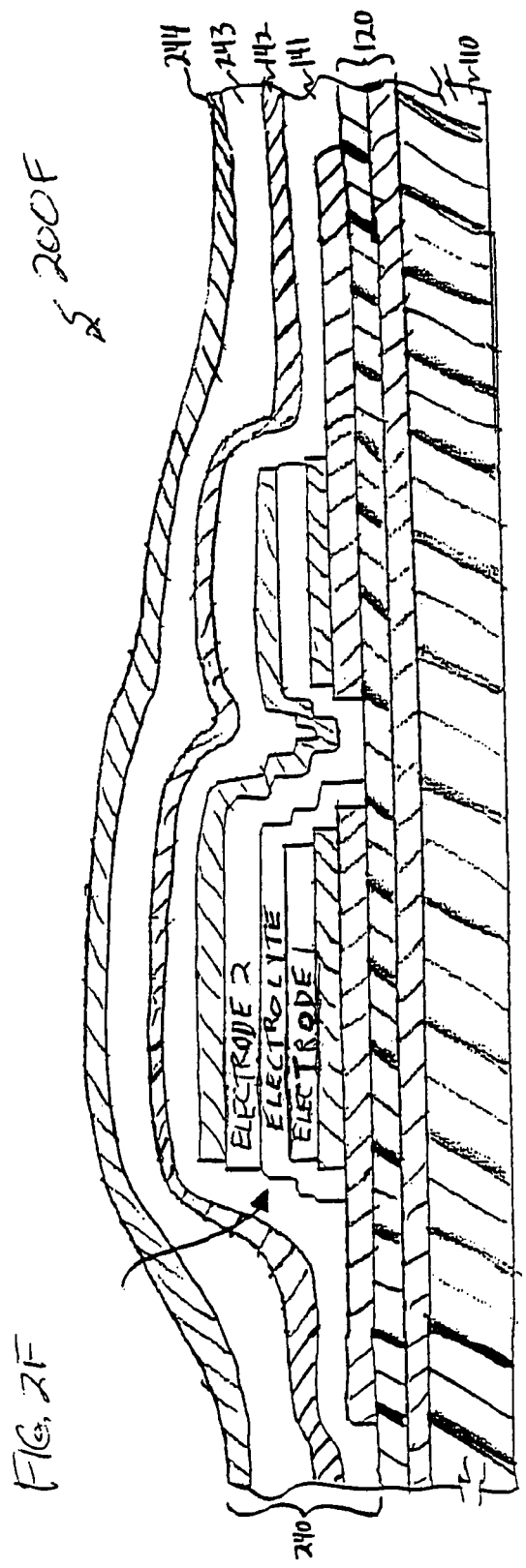

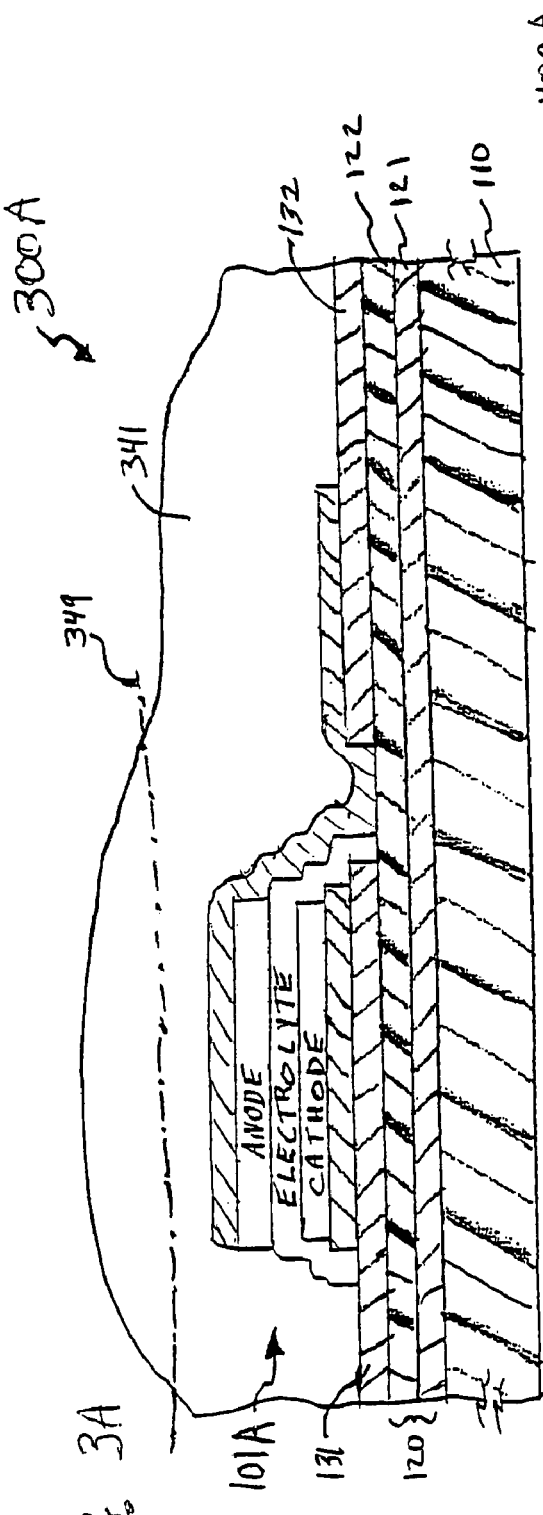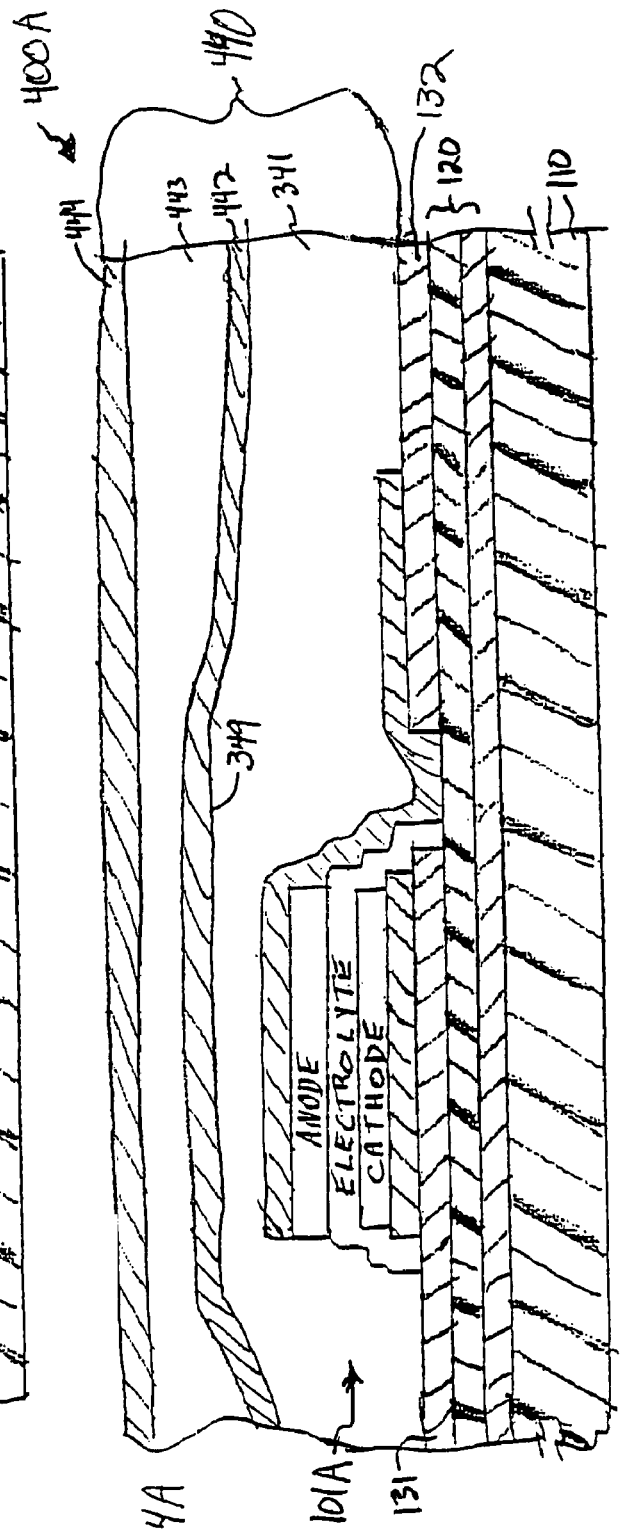

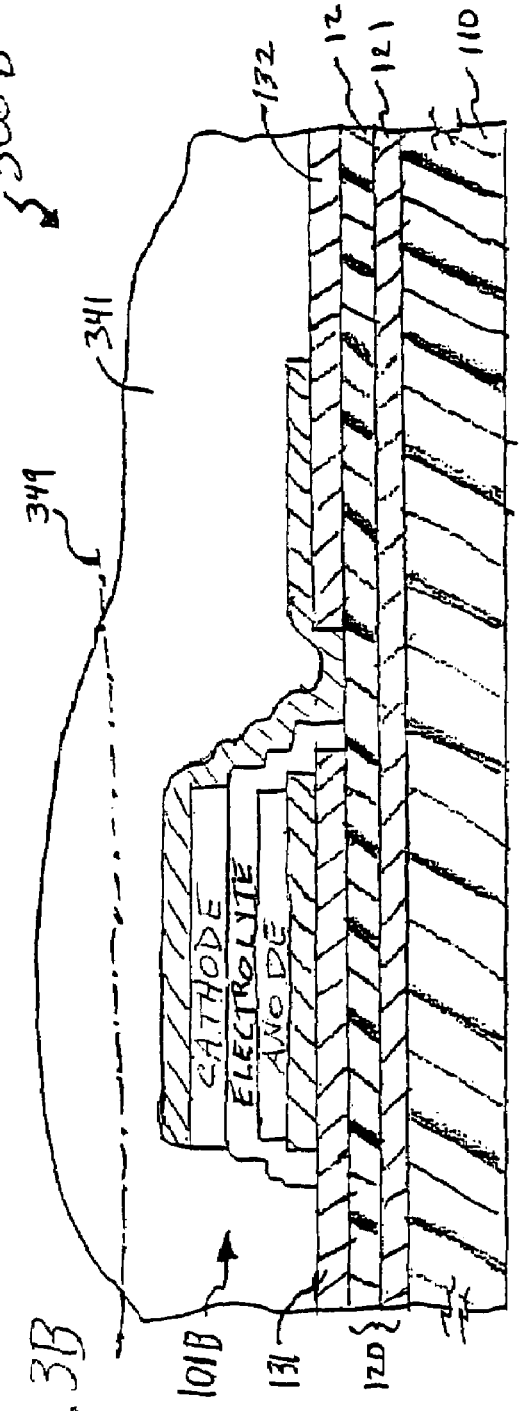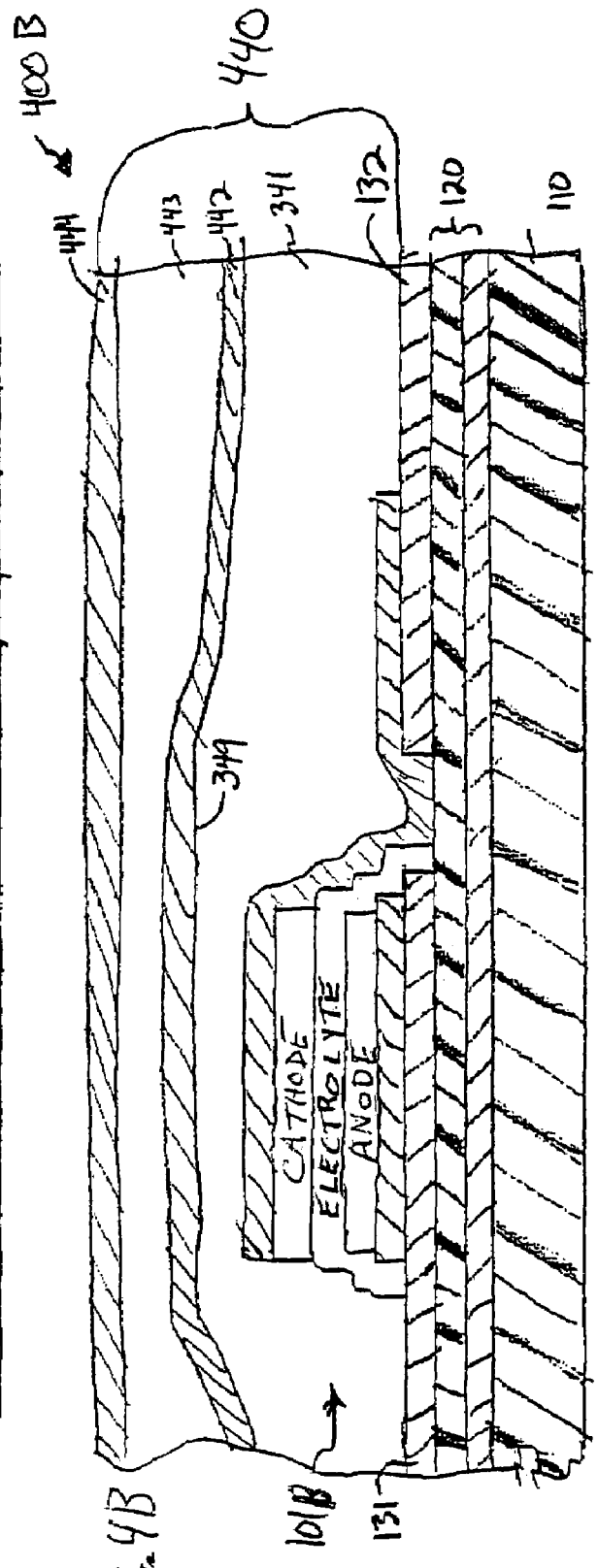

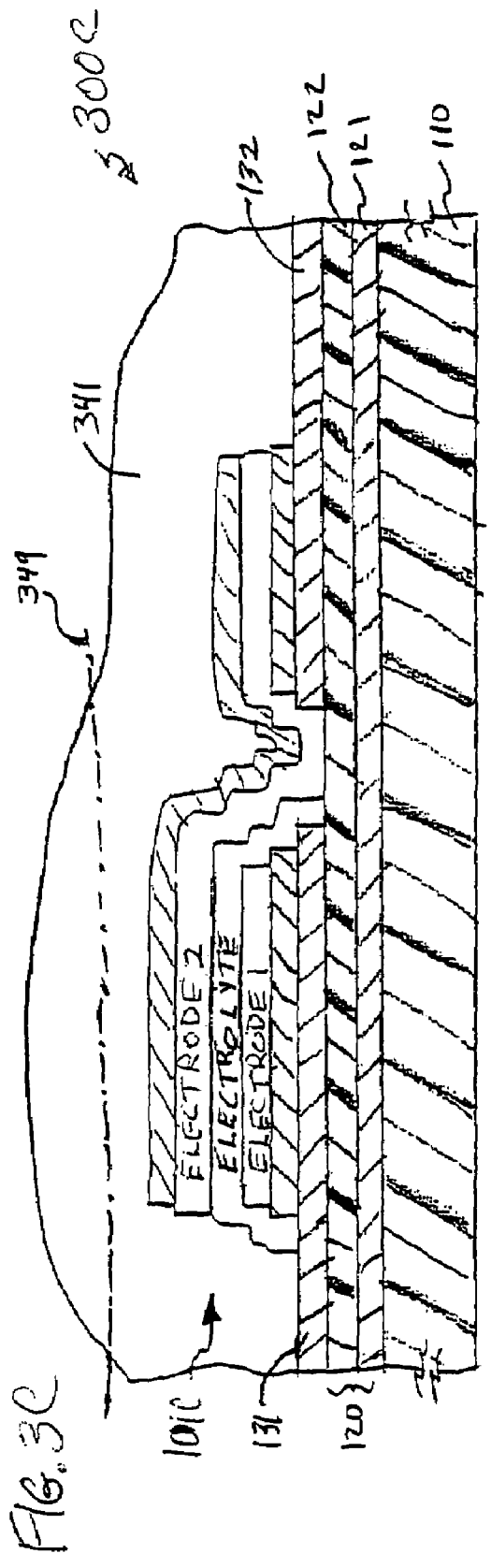
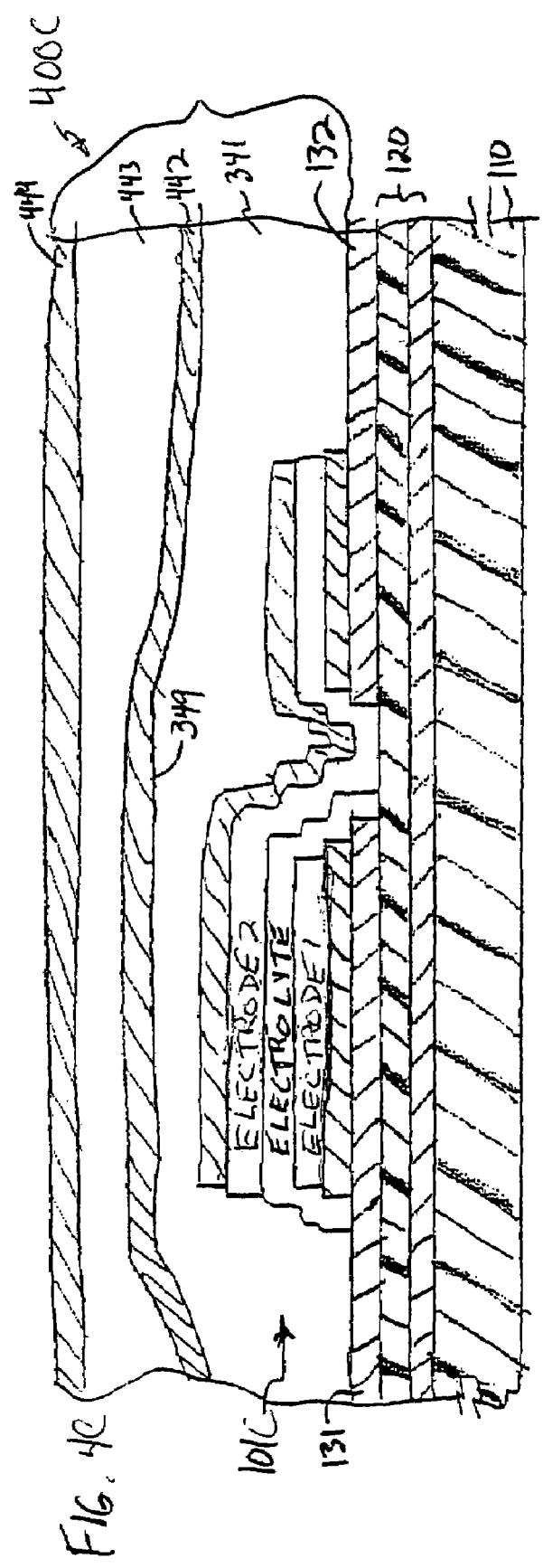

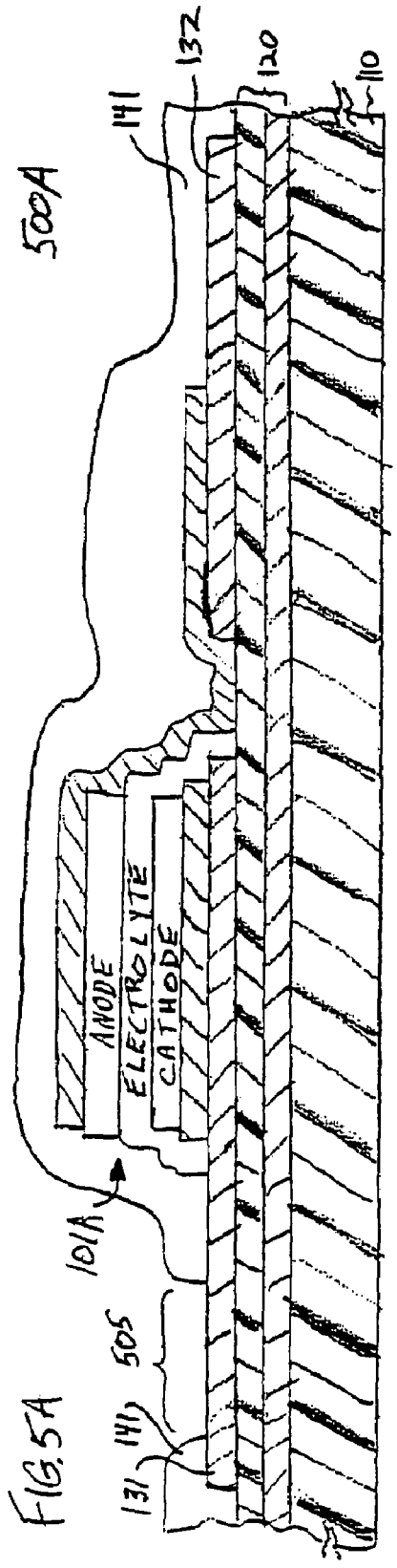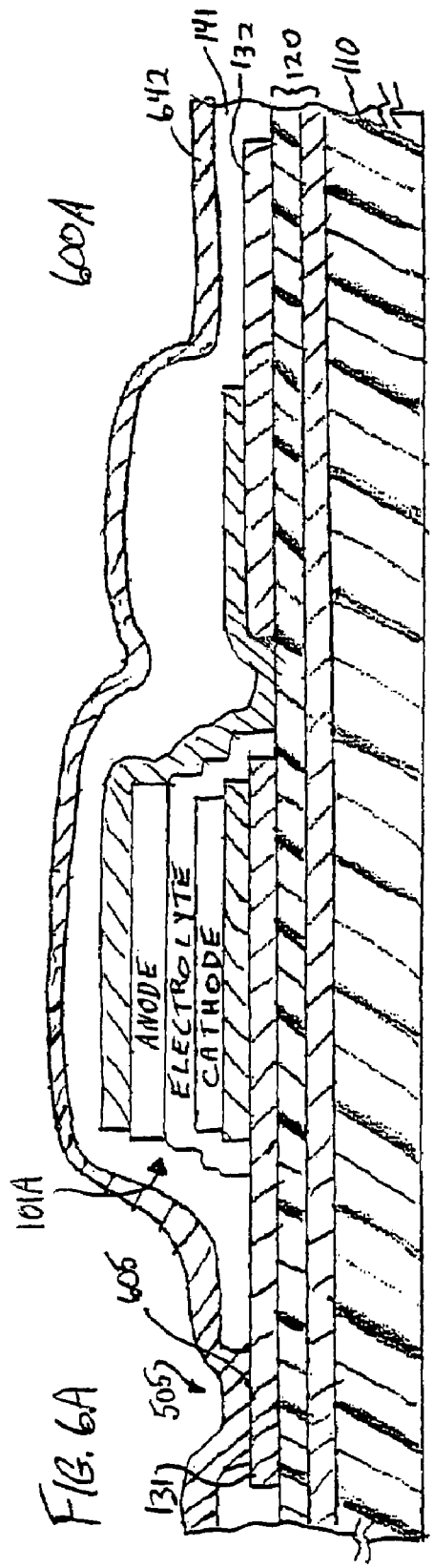

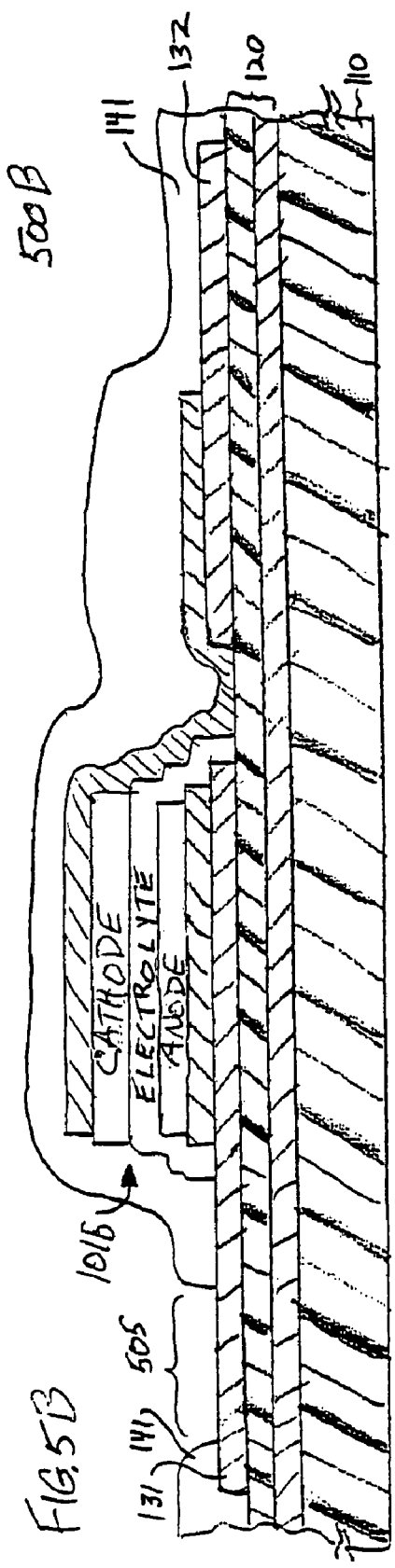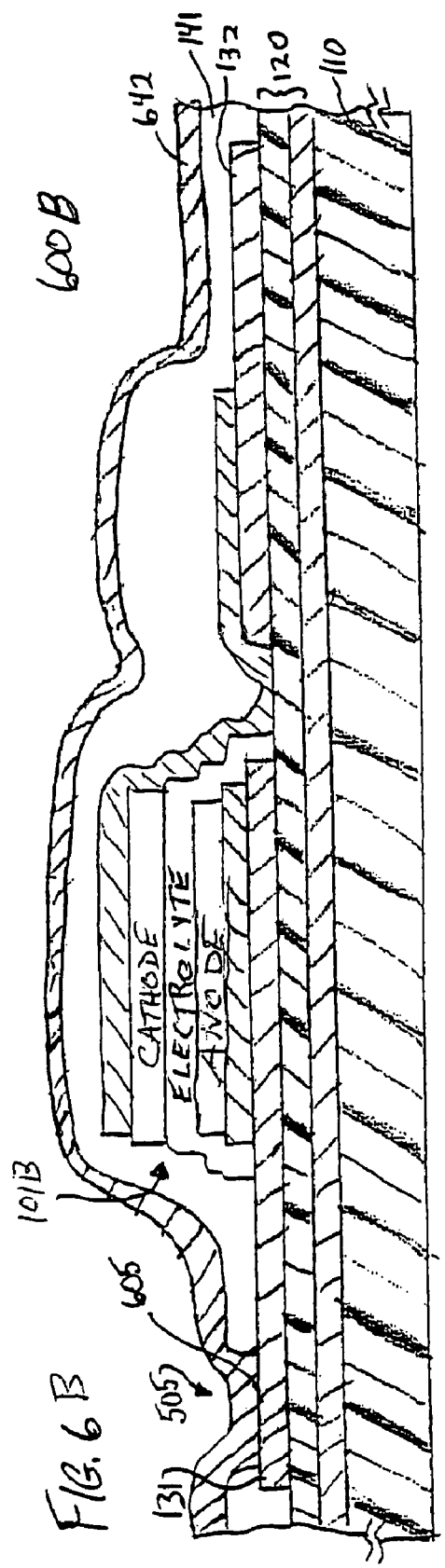

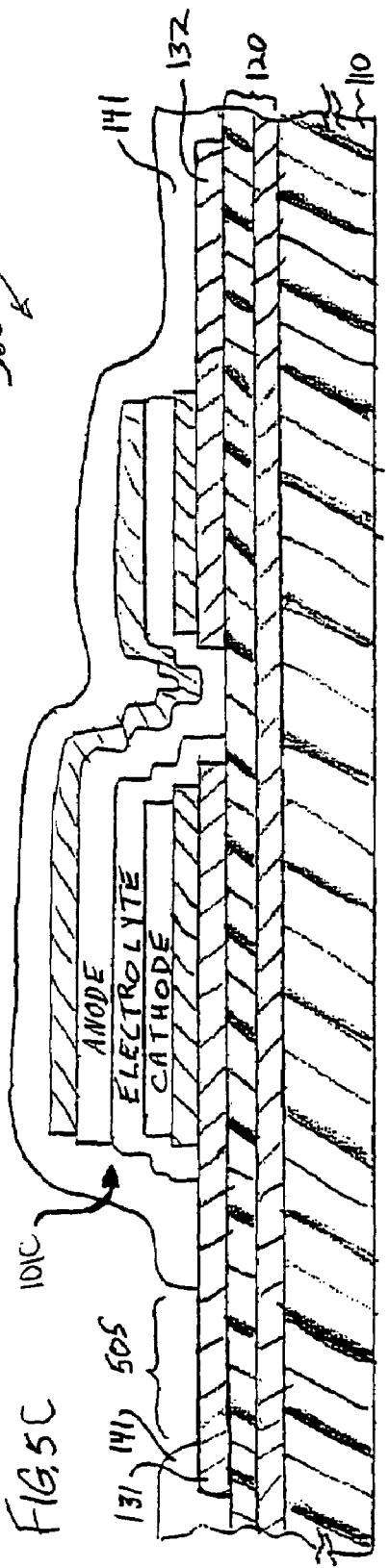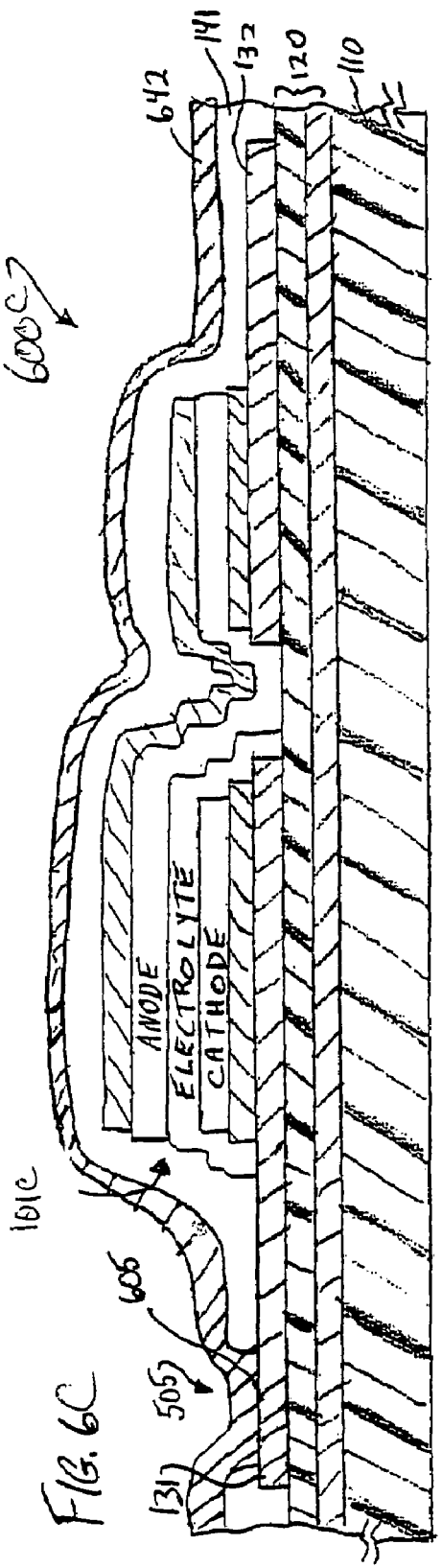

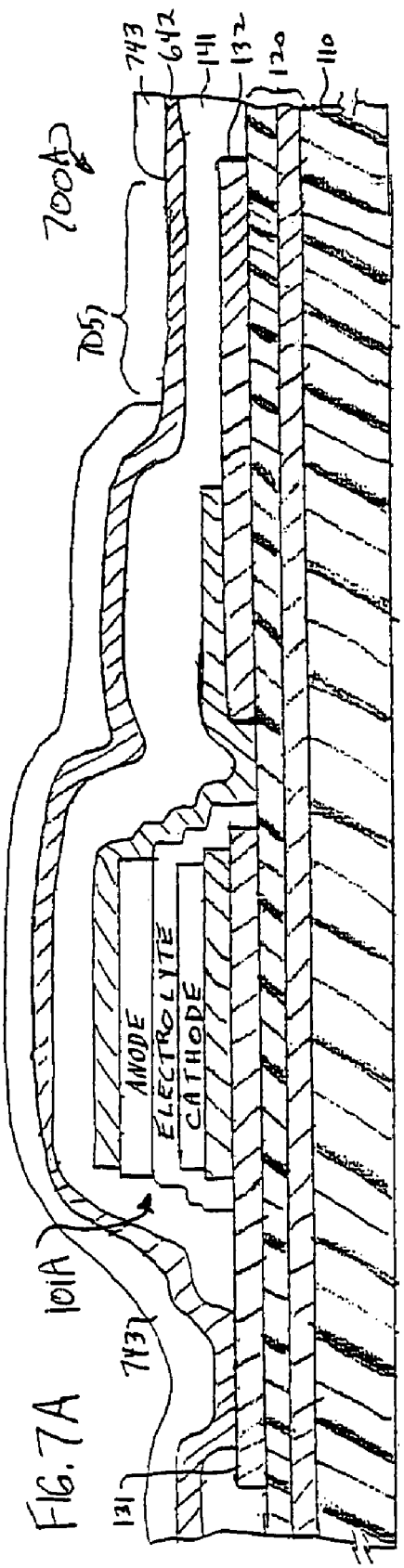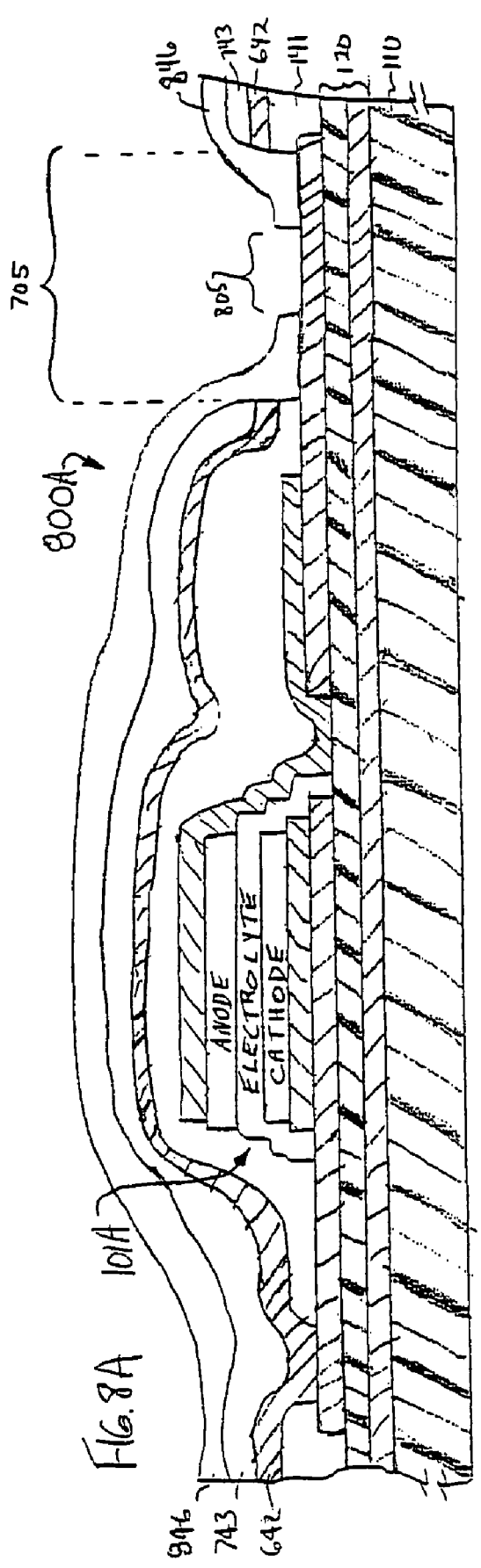

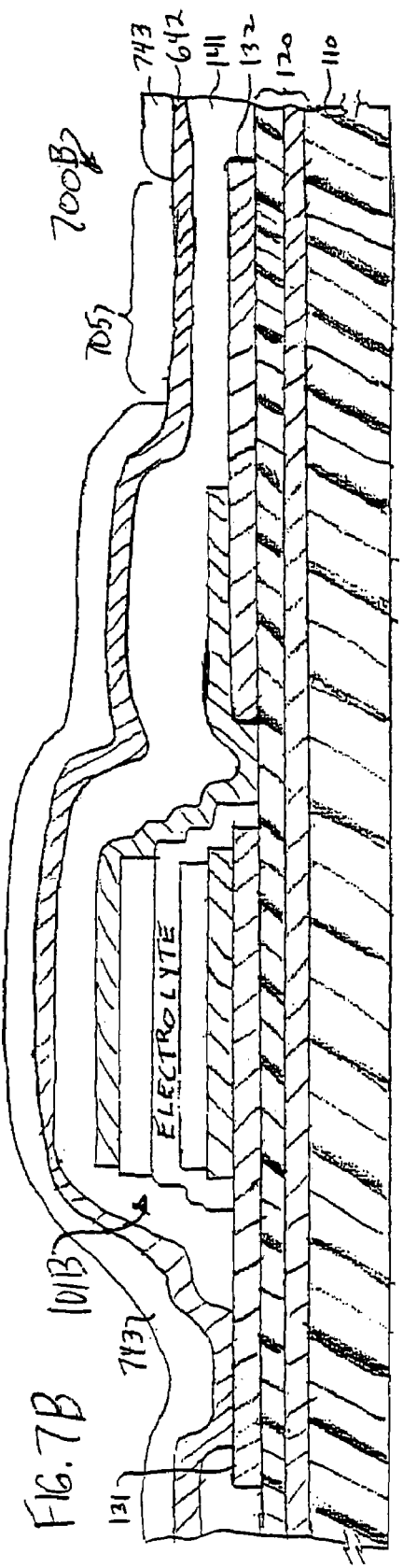
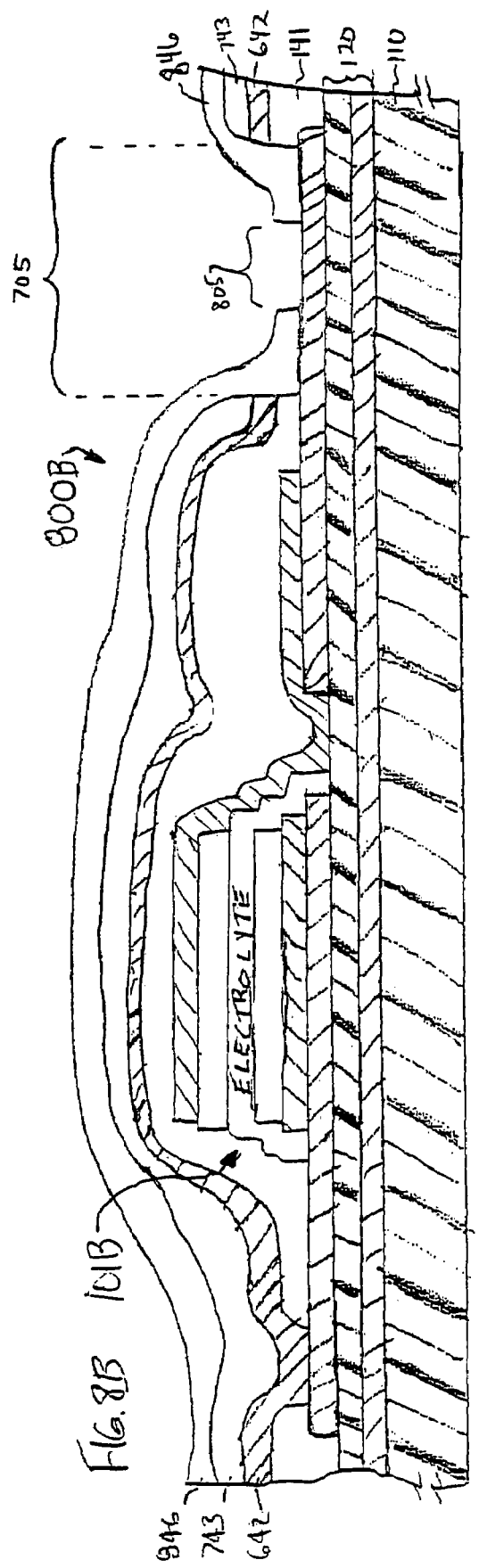

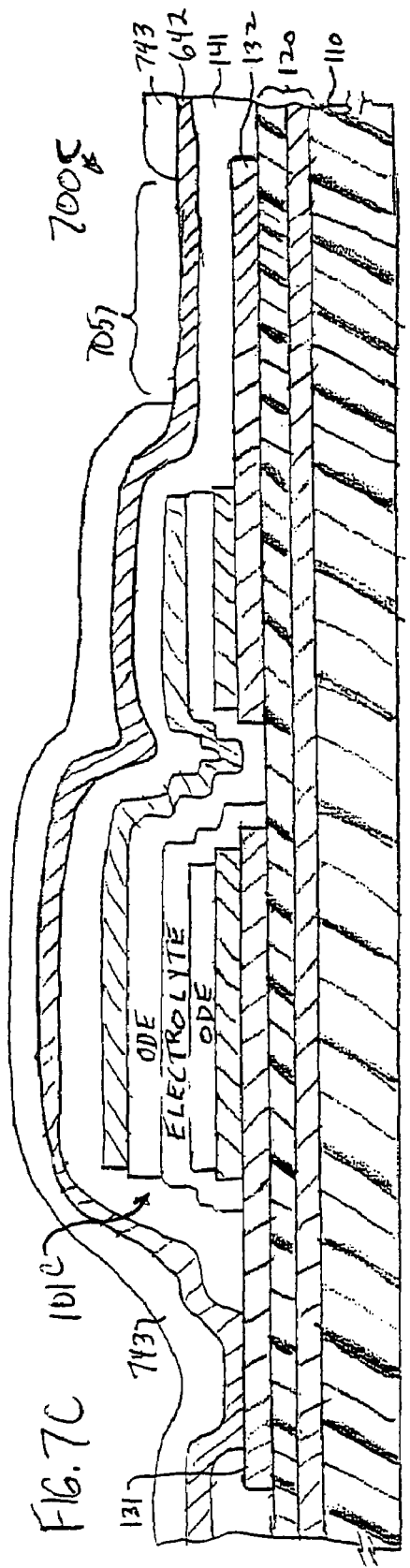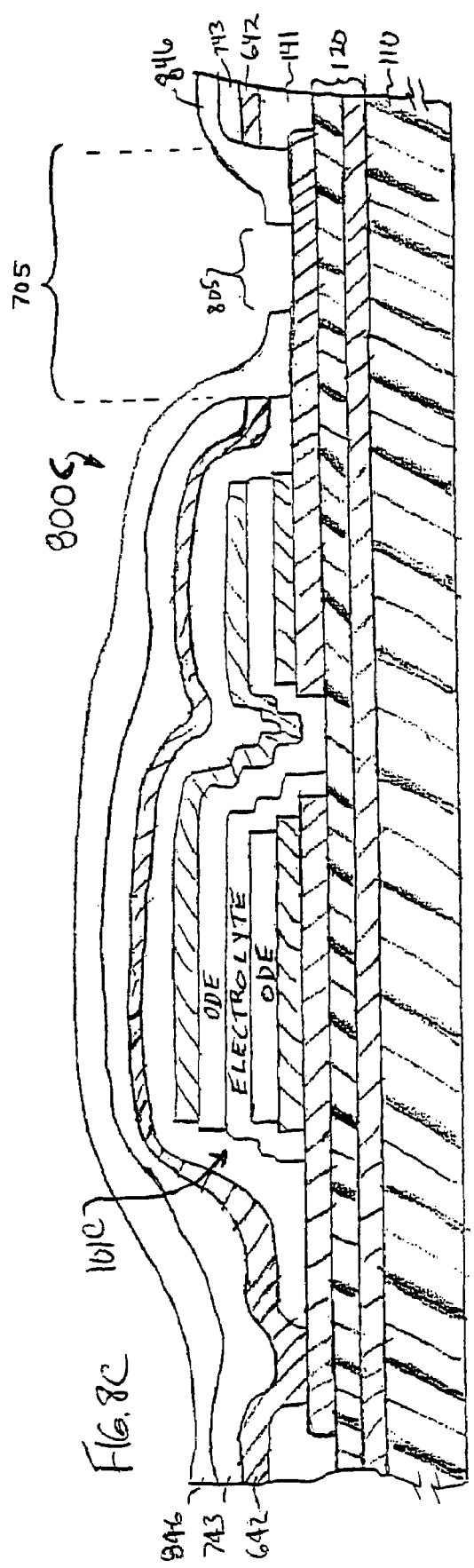

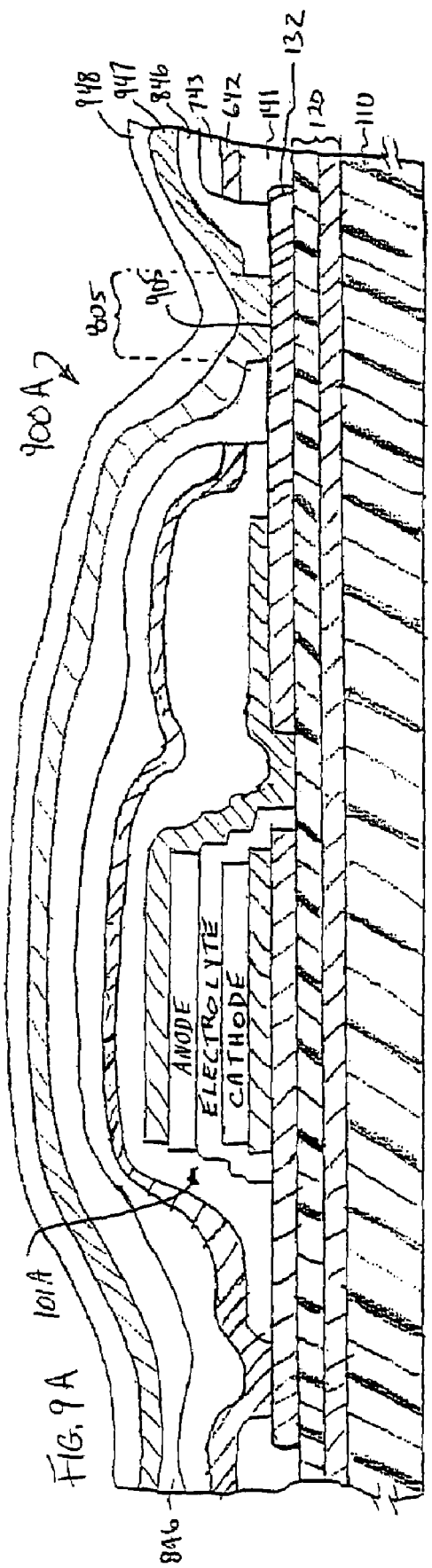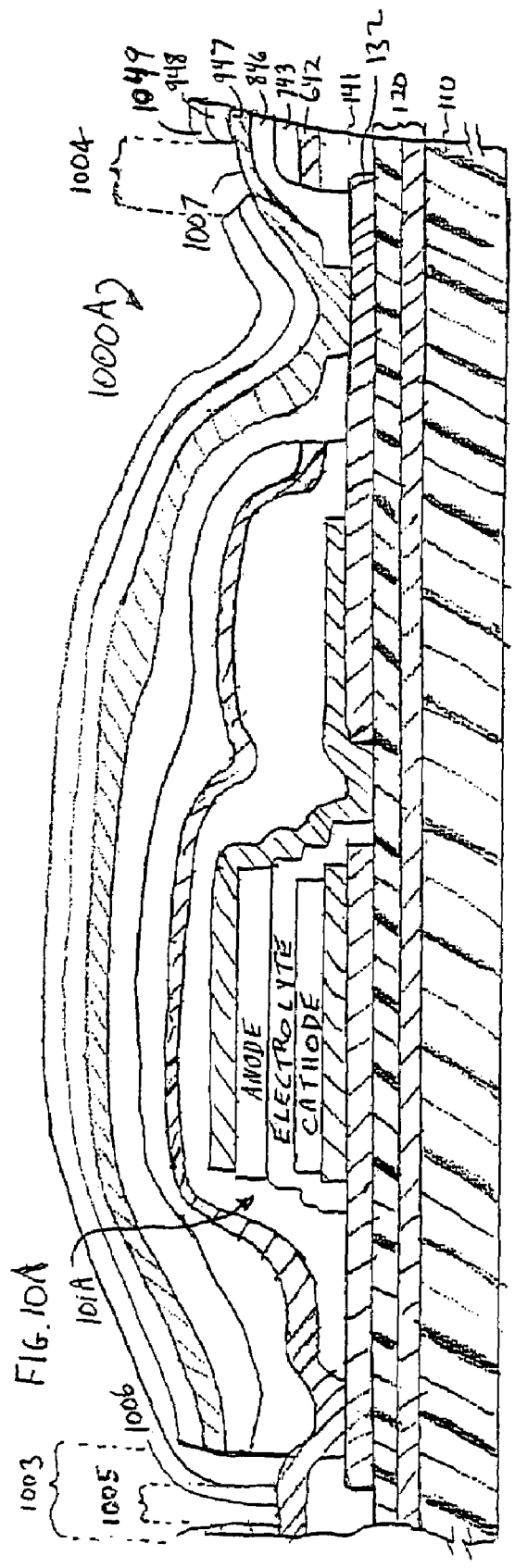

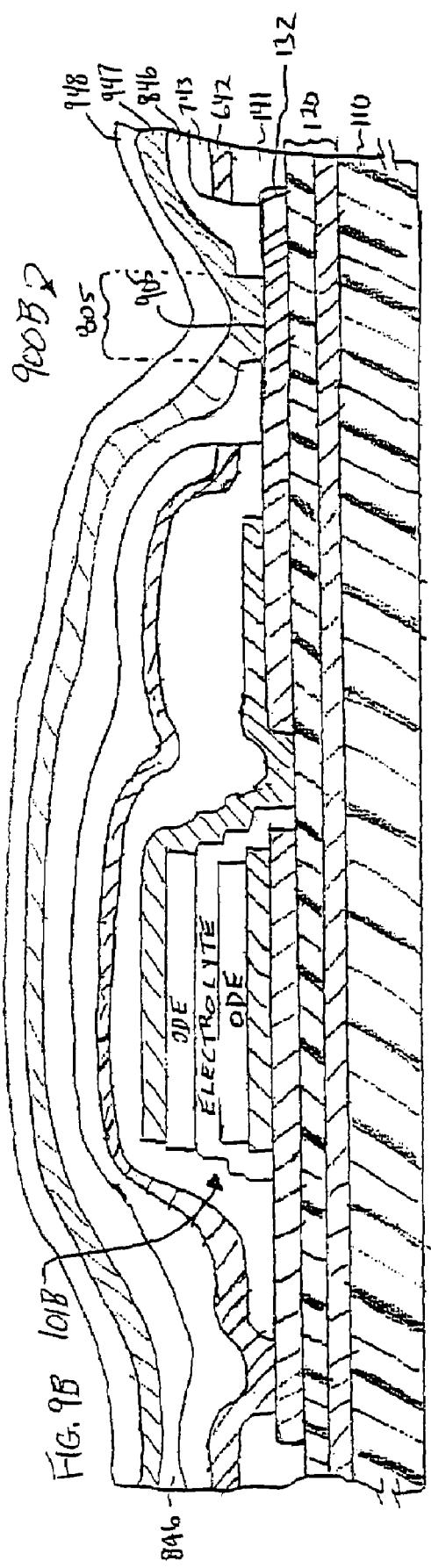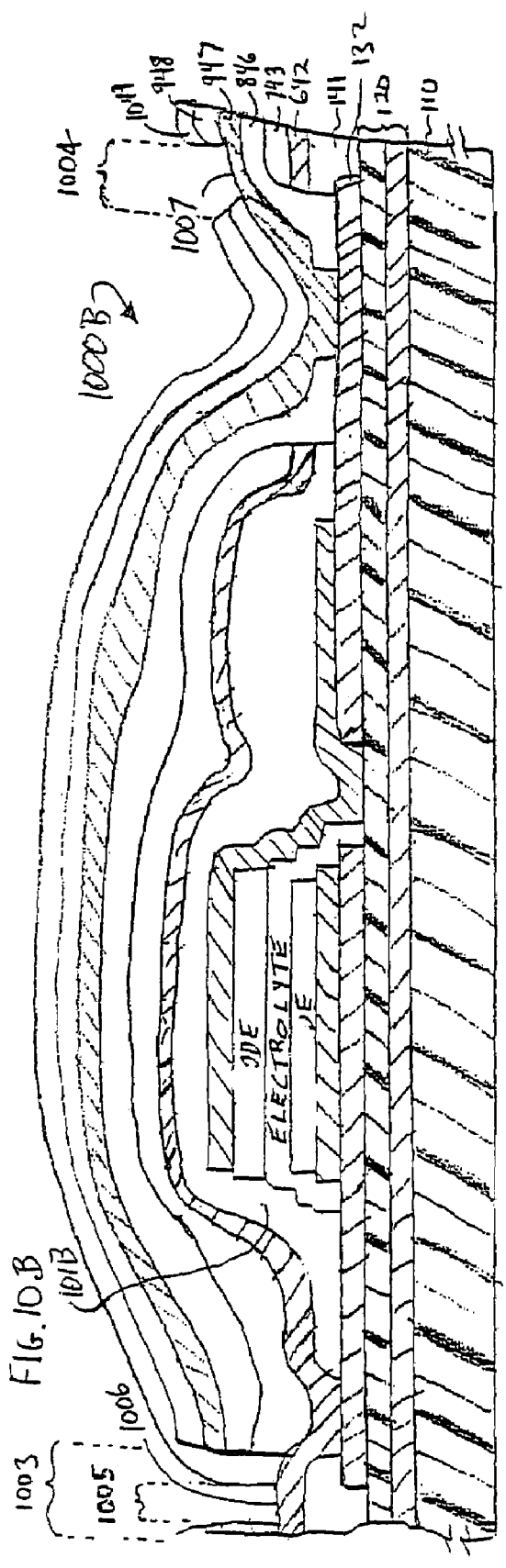

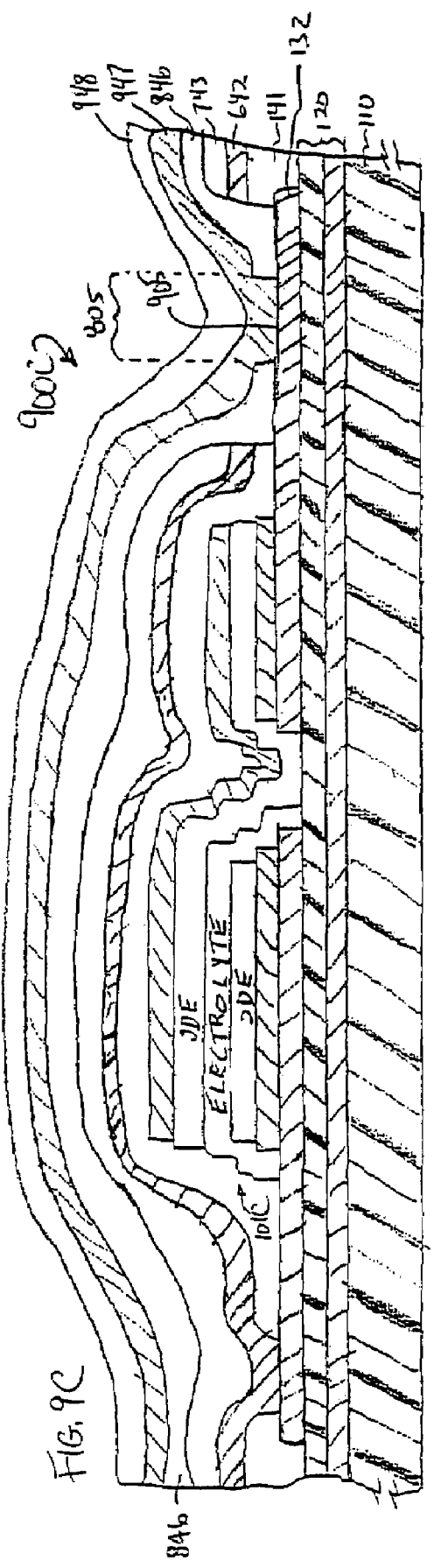

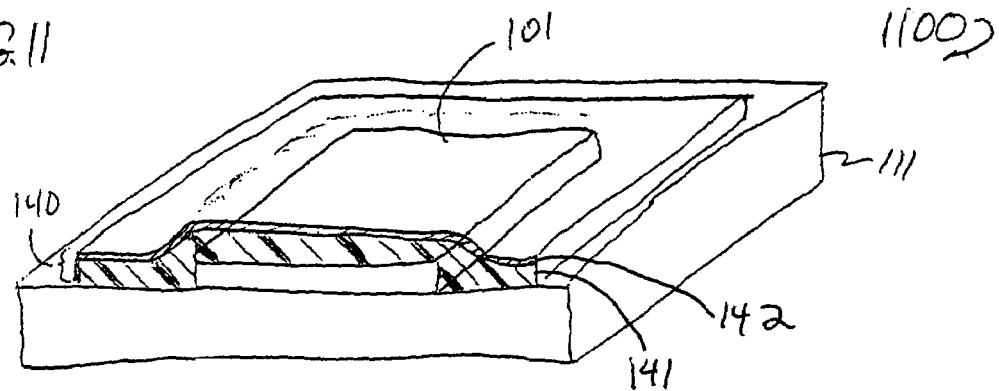
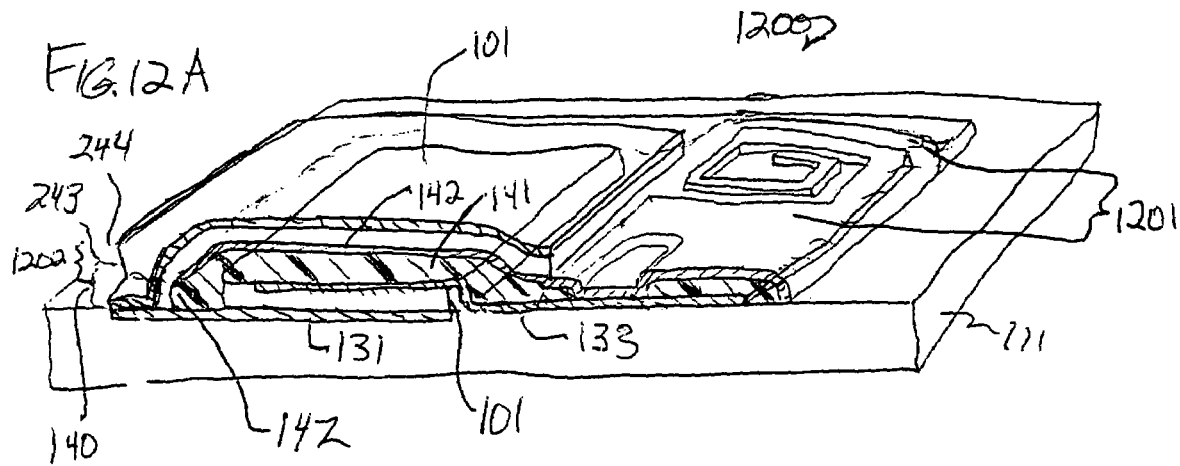
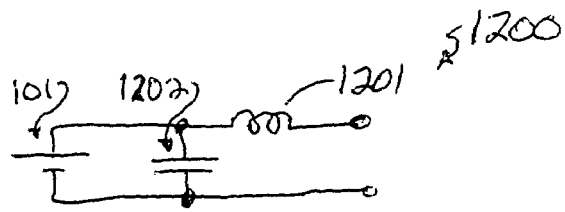

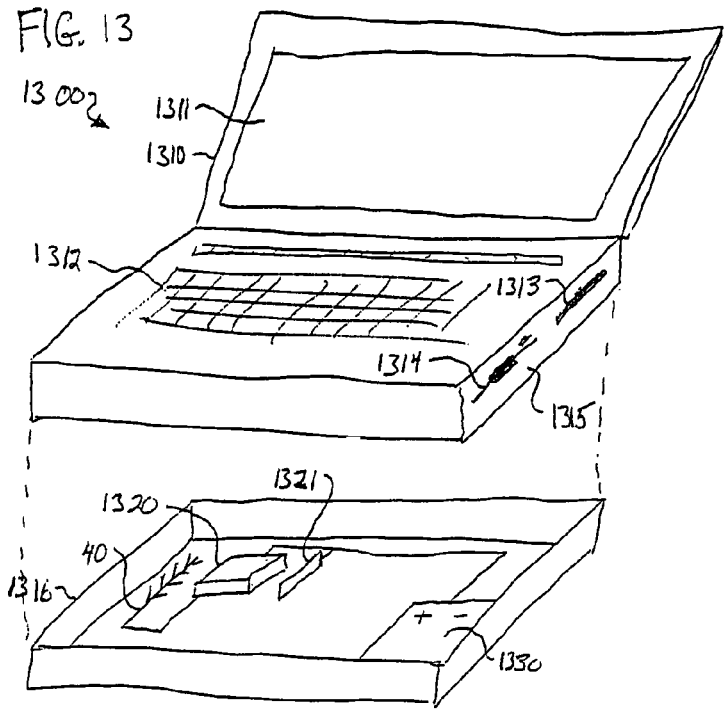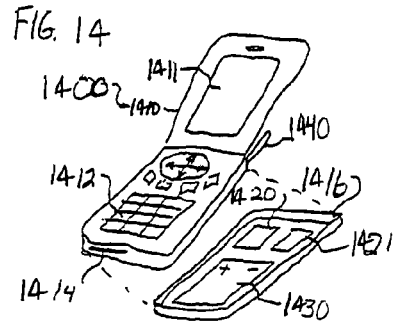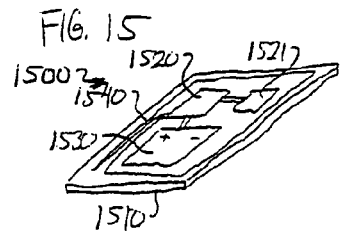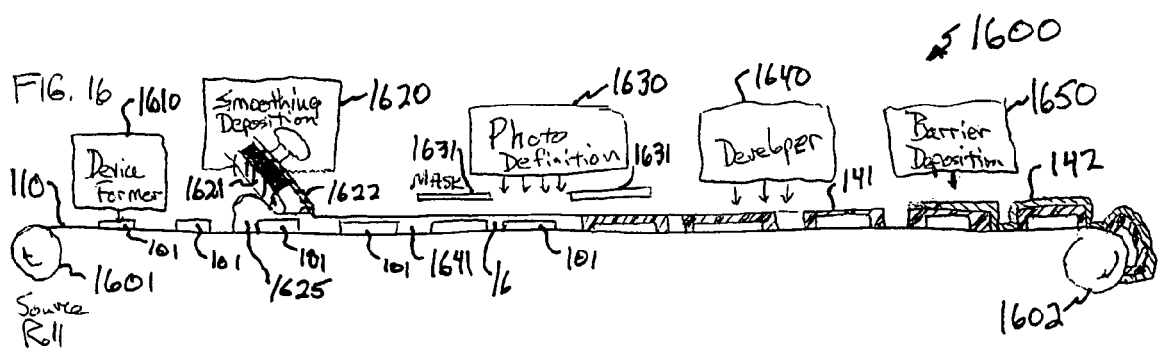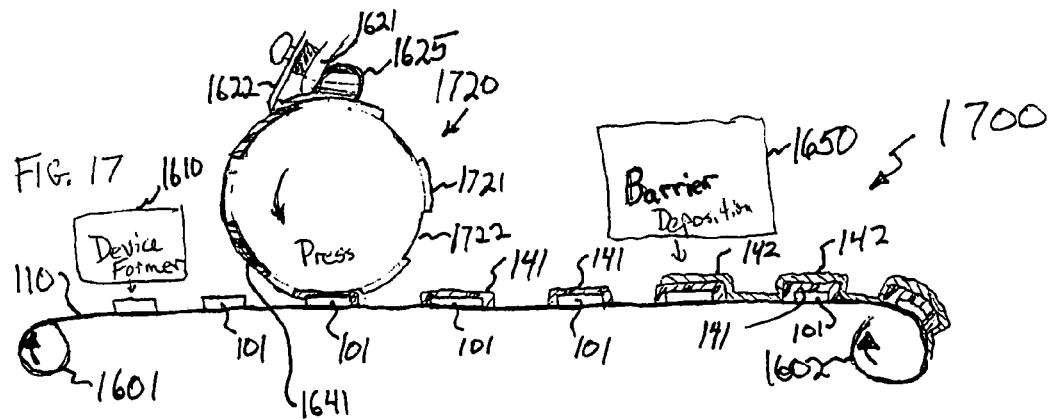

LAYERED BARRIER STRUCTURE HAVING ONE OR MORE DEFINABLE LAYERS AND METHOD

CROSS-REFERENCES TO RELATED INVENTIONS

This claims benefit of U.S. Provisional Patent Application Ser. No. 60/534,660, filed Jan. 6, 2004 by David J. Tarnowski and Mark L. Jenson.

This invention is related to U.S. Pat. No. 6,805,998 entitled "METHOD AND APPARATUS FOR INTEGRATED-BATTERY DEVICES," U.S. patent application Ser. No. 09/815,884 entitled "Battery-Operated Wireless-Communication Apparatus and Method," filed Mar. 23, 2001, and U.S. patent application Ser. No. 10/336,662 entitled "Active Wireless Tagging System On Peel And Stick Substrate," filed Jan. 2, 2003; each of which is incorporated by reference.

FIELD OF THE INVENTION

The present invention relates to solid-state energy-storage devices and integration of these devices with packaged circuits. More particularly, this invention relates to methods and systems for providing an environmental barrier to various apparatus, for example, those having a solid-state thin-film energy-storage device such as a lithium battery and other devices, wherein the barrier includes, and/or is defined by, photodefinable material.

BACKGROUND OF THE INVENTION

Electronics have been incorporated into many portable devices such as computers, mobile phones, tracking systems, scanners, etc. One drawback to portable devices is the need to include the power supply with the device. Portable devices typically use batteries as power supplies. Batteries must have sufficient capacity to power the device for at least the length of time the device is in use. Sufficient battery capacity can result in a power supply that is quite heavy or large compared to the rest of the device. In other words, current batteries generally are rather large and cannot be incorporated into small packages. There is a need for small batteries that can be formed for use in a small package integrated with electronics.

Most batteries today are fairly expensive. As a result, economics prevent a broader use of batteries. In other words, currently, retailers would rarely consider providing a battery as part of the packaging associated with many items. Typically, batteries may be provided as part of the product shipped but not as part of the packaging.

With certain types of battery chemistry, there is a problem of degradation due to detrimental environmental substances, such as oxygen and/or water vapor.

Thus, there is a further need for a battery that is reliable, has a long shelf life, and can be made inexpensively and mass-produced. There is still a further need for smaller and lighter batteries (i.e., power supplies) with sufficient energy storage that can be packaged with electronics to accomplish at least one function. There is also a need for a battery that can be fabricated from non-toxic materials. There is also a need for improved seals against detrimental environmental substances.

SUMMARY OF THE INVENTION

The present invention provides an environmental barrier (i.e., a barrier to gasses such as oxygen, water vapor, nitrogen or carbon dioxide, or other substances that are detrimental to certain compounds in a device, such as lithium or lithium compounds). The barrier is optionally useful for providing, or serving as, a conductor or other circuit component, for example, a capacitor, inductor, or other device in a circuit having a thin-film battery, such as one that includes lithium or lithium compounds, connected to an electronic chip.

In some embodiments, the invention provides a system that includes a substrate, a circuit connected to the substrate, and a thin-film battery connected to the substrate and connected to the circuit. The thin-film battery powers the circuit. In some embodiments, an environmental barrier is deposited as alternating layers, at least one of the layers providing a smoothing, planarizing, and/or leveling physical-configuration function, and at least one other layer providing a diffusion-barrier function. In some embodiments, the layer providing the physical-configuration function includes a photoresist, a photodefinable, an energy-definable, and/or a maskable layer, wherein definable means definable in lateral extent (i.e., the extent in size, area, and/or shape). In some embodiments, the physical-configuration layer is a dielectric. In some embodiments, the diffusion barrier layer includes a dielectric. In other embodiments, the diffusion barrier layer includes a metal.

Accordingly, the present invention provides an apparatus and methods to make and use the apparatus. Generally, the apparatus utilizes the movement of lithium ions from one electrode to another to generate an electrical current. In some embodiments the apparatus can function as a battery. In one embodiment, the battery is sputtered or otherwise formed as a film onto the substrate, and the circuit is formed on the battery. In another embodiment, the circuit is sputtered or otherwise formed as a film onto the substrate, and the battery is sputtered or otherwise formed as layers or films onto the circuit. The circuit and battery are sealed against environmental contaminants by a layered barrier structure having one or more definable layers. In some embodiments, the one or more definable layers include one or more physical-configuration layers and one or more diffusion-barrier layers. For example, some embodiments include a physical-configuration layer that includes photoresist material used to smooth and level over the areas being sealed (for example, over a solid-state lithium battery). In some such embodiments, the photoresist also provides a photodefinable mask function over other areas of the device, for example, allowing conductive contacts to be selectively placed where desired. As for the diffusion-barrier layer, some embodiments use an aluminum-metal material and/or a silicon oxide material. In some embodiments, alternating layers of metal and dielectric are used to provide a functional circuit component, such as a capacitor, as well as providing a diffusion barrier for the underlying components.

In some embodiments, an adhesive is attached to the substrate wherein the sealed system is adhesively attached to some object or device. For example, a radio-frequency battery-operated tracking label that can be attached to a package for tracking during shipment.

Advantageously, in some embodiments, the systems include one or more batteries and optionally devices to enable or activate the battery or batteries, and a circuit can be formed and sealed with an environmental barrier on a film, and placed into small packages or products. In addition, the batteries, activation device and a circuit can be formed on a flexible sheet having an adhesive thereon so that the package essentially is a label that can be placed on the outside of a package or with the product packaging or on the product or device. A complete system can also be incorporated into a product or device to control an aspect of the device or record information about the product or device.

In some embodiments, layered structures are utilized, including a plurality of deposited pairs of layers, each pair including a physical configuration layer and a barrier layer with low gas-transmission rates (e.g., less than 0.1 ml gas per square meter per day). In some embodiments, such layered structures having several pairs of layers are effective in reducing gas transmission to levels effective in reducing corrosion and other deleterious reactions with the materials in batteries or other sealed components (i.e., to levels below the detection limits of transmission-rate-determining instrumentation.)

In some embodiments, the entire system is inexpensive. As a result, these systems can affordably be used on a widespread basis. As a result, manufacturers, wholesalers and even retailers could provide such a system either attached to a device or as part of the packaging associated with many devices or products. In addition, these systems are light and provide sufficient energy storage to accomplish at least one function. The system is fabricated from non-toxic materials so that a hazard is not being created when used with a product or device.

BRIEF DESCRIPTION OF THE DRAWINGS

FIG. 1A is a cross-sectional view of an energy-storage device 100A with an environmental barrier according to the present invention as fabricated.

FIG. 1B is a cross-sectional view of an energy-storage device 100B with an environmental barrier according to the present invention, after being charged.

FIG. 1C is a schematic diagram 100C corresponding to apparatus 100B of FIG. 1B.

FIG. 1D is a cross-sectional view of an apparatus 190 used in some embodiments to plate lithium through a solid permeable electrolyte protective layer to form an anode.

FIG. 2A is a cross-sectional view of an energy-storage device 200A with an environmental barrier according to the present invention.

FIG. 2B is a cross-sectional view of an energy-storage device 200B with an environmental barrier according to the present invention.

FIG. 2C is a cross-sectional view of an energy-storage device 200C with an environmental barrier according to the present invention.

FIG. 2D is a cross-sectional view of an energy-storage device 200D with a multi-layer environmental barrier.

FIG. 2E is a cross-sectional view of an energy-storage device 200E with a multi-layer environmental barrier.

FIG. 2F is a cross-sectional view of an energy-storage device 200F with a multi-layer environmental barrier.

FIG. 3A is a cross-sectional view of an energy-storage device 300A with a planarizing environmental barrier part way in the process of being made.

FIG. 3B is a cross-sectional view of an energy-storage device 300B with a planarizing environmental barrier part way in the process of being made.

FIG. 3C is a cross-sectional view of an energy-storage device 300C with a planarizing environmental barrier part way in the process of being made.

FIG. 4A is a cross-sectional view of an energy-storage device 400A with a planarized multi-layer environmental barrier.

FIG. 4B is a cross-sectional view of an energy-storage device 400B with a planarized multi-layer environmental barrier.

FIG. 4C is a cross-sectional view of an energy-storage device 400C with a planarized multi-layer environmental barrier.

FIG. 5A is a cross-sectional view of an energy-storage device 500A with an environmental barrier that includes a photodefinable portion, early in the process of being made.

FIG. 5B is a cross-sectional view of an energy-storage device 500B with an environmental barrier that includes a photodefinable portion, early in the process of being made.

FIG. 5C is a cross-sectional view of an energy-storage device 500C with an environmental barrier that includes a photodefinable portion, early in the process of being made.

FIG. 6A is a cross-sectional view of an energy-storage device 600A with an environmental barrier that includes a photodefinable portion, later in the process of being made.

FIG. 6B is a cross-sectional view of an energy-storage device 600B with an environmental barrier that includes a photodefinable portion, later in the process of being made.

FIG. 6C is a cross-sectional view of an energy-storage device 600C with an environmental barrier that includes a photodefinable portion, later in the process of being made.

FIG. 7A is a cross-sectional view of an energy-storage device 700A with an environmental barrier that includes a photodefinable portion, still later in the process of being made.

FIG. 7B is a cross-sectional view of an energy-storage device 700B with an environmental barrier that includes a photodefinable portion, still later in the process of being made.

FIG. 7C is a cross-sectional view of an energy-storage device 700C with an environmental barrier that includes a photodefinable portion, still later in the process of being made.

FIG. 8A is a cross-sectional view of an energy-storage device 800A with an environmental barrier that includes a photodefinable portion, yet later in the process of being made.

FIG. 8B is a cross-sectional view of an energy-storage device 800B with an environmental barrier that includes a photodefinable portion, yet later in the process of being made.

FIG. 8C is a cross-sectional view of an energy-storage device 800C with an environmental barrier that includes a photodefinable portion, yet later in the process of being made.

FIG. 9A is a cross-sectional view of an energy-storage device 900A with an environmental barrier that includes a photodefinable portion, yet later in the process of being made.

FIG. 9B is a cross-sectional view of an energy-storage device 900B with an environmental barrier that includes a photodefinable portion, later in the process of being made.

FIG. 9C is a cross-sectional view of an energy-storage device 900C with an environmental barrier that includes a photodefinable portion, later in the process of being made.

FIG. 10A is a cross-sectional view of an alternative energy-storage device 1000A with an environmental barrier that includes a photodefinable portion, yet later in the process of being made.

FIG. 10B is a cross-sectional view of an alternative energy-storage device 1000B with an environmental barrier that includes a photodefinable portion, yet later in the process of being made.

FIG. 10C is a cross-sectional view of an alternative energy-storage device 1000C with an environmental barrier that includes a photodefinable portion, yet later in the process of being made.

FIG. 11 is a cross-sectional and perspective view of a generic device with an environmental barrier.

FIG. 12A is a cross-sectional and perspective view of a device with an environmental barrier that includes a photodefinable portion.

FIG. 12B is a schematic circuit diagram of apparatus 1200 of FIG. 12A.

FIG. 13 is an exploded perspective view of an embodiment of a device as part of a system.

FIG. 14 is an exploded perspective view of another embodiment of a device as part of a portable system.

FIG. 15 is a perspective view of a smart-card device.

FIG. 16 is a schematic of a roll-to-roll process 1600 that deposits a smoothing layer using a doctor blade 1622 and then photo-defines the extent of the smoothing layer.

FIG. 17 is a schematic of a roll-to-roll process 1700 that deposits a smoothing layer using an offset press that defines the extent of the smoothing layer.

In the drawings, like numerals describe substantially similar components throughout the several views of the process of being made. Signals and connections may be referred to by the same reference number, and the meaning will be clear from the context of the description.

DETAILED DESCRIPTION

In the following detailed description of preferred embodiments, reference is made to the accompanying drawings that form a part hereof, and in which are shown, by way of illustration, specific embodiments in which the invention may be practiced. It is to be understood that other embodiments may be utilized and structural changes may be made without departing from the scope of the present invention.

It is to be understood that in different embodiments of the invention, each battery in the Figures or the description can be implemented using one or more cells, and if a plurality of cells is implemented, the cells can be wired in parallel or in series. Thus, where a battery or more than one cell is shown or described, other embodiments use a single cell, and where a single cell is shown or described, other embodiments use a battery or more than one cell. Further, the references to relative terms such as top, bottom, upper, lower, etc. refer to an example orientation such as used in the Figures, and not necessarily an orientation used during fabrication or use.

The terms wafer and substrate as used herein include any structure having an exposed surface onto which a film or layer is deposited, for example, to form an integrated circuit (IC) structure or an energy-storage device. The term substrate is understood to include semiconductor wafers, plastic film, metal foil, glass, inorganic polymers, organic polymers, silicates, Mylar film, and other materials and structures on which an energy-storage device may be fabricated according to the teachings of the present disclosure. A substrate may also include additional layers that have been fabricated thereupon. These additional layers may include additional structures, such as semiconductors, coils, antennas, and the like. For example, a wafer and substrate may include doped and undoped semiconductors, epitaxial semiconductor layers supported by a base semiconductor or insulator, as well as other semiconductor structures well known to one skilled in the art. A substrate can also be used to describe any starting material that is useable with the fabrication method as described herein during which a film or layer is deposited onto the substrate.

The term battery as used herein refers to an energy-storage device, having one or more cells, that provides electrical current when connected to a load by the transport of ions across an electrolyte. The movement of ions is between an anode and a cathode, and the direction of the ions depends on whether the battery is charging or discharging. One example of a solid-state battery is a lithium-ion cell having a LiPON electrolyte. A battery may be formed of a single cell or a plurality of cells connected in series or in parallel. A cell is a galvanic unit that converts chemical energy, e.g., ionic energy, to electrical energy. The cell typically includes two electrodes, a cathode and an anode, that are isolated from each other by an electrolyte through which ions can move.

Electrodes can be made from the same material or from different materials. In a battery, the electrodes include the anode and the cathode. As used herein, the anode will be the negative electrode and the cathode will be the positive electrode. In a capacitor, the electrodes are the plates located adjacent to the dielectric. Examples of materials that can be used alone or in combination to fabricate a cathode include lithium cobalt oxide, lithium manganese oxide, lithium iron phosphate, lithium vanadium oxide, lithium nickel oxide, and the like. In some embodiments, a cathode collector such as nickel is used to provide enhanced electrical conductivity for the cathode. In some embodiments, cathodes are fabricated under non-oxidizing conditions. Mixed metal oxides (for example, those that include combinations of the above mentioned metals), such as lithium nickel cobalt oxide, can also be used to fabricate cathodes. Examples of materials that can be used to fabricate the current-collector portion of the negative electrodes (i.e., anodes) include copper, platinum, nickel, and the like. In some embodiments, this current-collector portion of the negative electrode (anode) is where lithium metal is to be formed (e.g., plated or deposited). In other embodiments, lithium ions are intercalated into the anode structure in materials such as graphite. In some embodiments, anodes are fabricated from other suitable metals and metal alloys, such as metals and metal alloys that reversibly combine with lithium ions. An electrode from which ions leave during the generation of an electrical current can be fabricated from an ion-releasing material. An electrode to which ions flow during the generation of an electrical current can be made from ion-retaining materials or from ion-releasing materials depending upon whether or not the battery is rechargeable. If the battery is rechargeable an ion-releasing material may be used to fabricate the electrode to which ions flow during the generation of an electrical current. If the battery is not rechargeable an ion-releasing material or an ion-retaining material may be used to fabricate the electrode to which ions flow during the generation of an electrical current.

An electrolyte is a material that allows an electrical current to be conducted through movement of ions between electrodes of a battery or cell. An electrolyte does not conduct electrons. An electrolyte can be liquid. An electrolyte can also be a solid, semi-solid, or combination of a porous solid and liquid, through which ions can pass. In some embodiments the electrolyte will be substantially chemically inert or non-reactive with regard to the ion or ions and electrode materials that are used to generate current within a battery or cell. Examples of materials that can act as electrolytes include lithium phosphorus oxynitride (LiPON), and the like, which can be deposited as a glass film or layer through which lithium ions can pass if a source of lithium ions and a destination for the lithium ions is provided.

A dielectric is a material in which an electric field may be maintained with zero or near-zero power dissipation, i.e., a material in which the electrical conductivity is zero or near zero. A dielectric material is an electrical insulator. In a dielectric, electrons are bound to atoms and molecules, hence there are few free electrons. Note that a LiPON film or layer can act as a dielectric if sandwiched between electrodes that do not provide lithium ions, for example if between layers of copper, aluminum, polycrystalline silicon, or the like. Such a conductor—LiPON—conductor structure will form a capacitor.

An electrode of a battery may be operably coupled to a current collector so that the electrode is in electrical contact with the current collector. For example, an anode may be coupled to an anode current collector and a cathode may be coupled to a cathode current collector. Such current collectors, typically made of a metal such as copper or aluminum, provide electrical contacts that can be used to direct electrical current generated by the battery. Current collectors can be made from electrically conductive materials such as copper, aluminum, nickel, iron, gold, silver, platinum, molybdenum, manganese, metal alloys, conductive ceramics, conductive semiconductors such as heavily doped polycrystalline silicon, and the like. In some embodiments, the cathode current collector is electrically coupled across the outside face of the cathode and the anode current collector is electrically coupled across the outside face of the anode to reduce resistance to current flow through these electrodes, and to reduce the creation of uneven flow of ions between electrodes during the generation of electrical current.

An apparatus of the invention can include an insulator layer. Insulator layers are generally fabricated from materials that conduct little or no electrical current. Examples of insulators include silicon oxide, silicon nitride, aluminum oxide, LiPON (depending on the interface materials), polymers, or other suitable electrical insulators.

In some embodiments, an apparatus of the invention includes a smoothing layer. A smoothing layer may be fabricated from one material or from a plurality of different materials. In some embodiments, the smoothing layer can include an adhesive layer. Such an adhesive layer is exemplified by a layer that contains chrome. A smoothing layer is a layer that is applied during fabrication of the apparatus to provide a uniform surface on the apparatus onto which another layer, such as a barrier layer or a current collector, is applied. A smoothing layer may be processed to shape the smoothing layer into a desired configuration. For example, a smoothing layer may be applied during the fabrication of an apparatus of the invention and then ground to produce a flat surface. Numerous other configurations can be produced. In some embodiments an insulator layer is utilized as a smoothing layer. Numerous materials may be used to produce a smoothing layer. Examples of such materials include polymers, glasses, photoresists, inks, and the like. In some embodiments, the smoothing layer is spun on. In other embodiments, the smoothing layer is dip coated. In other embodiments, the smoothing layer is cast on. In some embodiments, the smoothing layer is "squeegeed" and/or doctor-bladed in place onto devices on a roll-to-roll substrate. In some embodiments, the smoothing layer is deposited by an apparatus that is essentially an offset printing press, wherein a smoothing material and/or solvent mix ("ink") printed to the areas to which the smoothing layer is desired.

A plurality of smoothing layers and/or barrier layers may be added to an apparatus of the invention. Additionally, a smoothing layer and a barrier layer may be applied to an apparatus of the invention to produce a barrier structure. Accordingly, a plurality of barrier structures can be applied to an apparatus of the invention by repeatedly alternately applying a smoothing layer and one or more barrier layers to the apparatus.

An apparatus of the invention can include a barrier layer. Some examples of barrier layers are generally described in U.S. Pat. No. 6,413,645. A barrier layer may be applied to an apparatus to prevent passage of a detrimental substance from the environment into the apparatus. For example, a barrier layer may be used to block entry of oxygen, water vapor, or water from the environment into the apparatus. A plurality of materials may be used to fabricate a barrier layer. Examples of such materials include metals that are exemplified by copper, chromium, aluminum, silver, gold, platinum, and the like. Metal compounds such as metal oxides, metal nitrides, metal carbides, metal oxynitrides, metal oxyborides, and combinations thereof can be used to fabricate barrier layers. Examples of metal oxides include silicon oxide, aluminum oxide, titanium oxide, indium oxide, tin oxide, indium tin oxide, tantalum oxide, zirconium oxide, niobium oxide, and the like. Examples of metal nitrides include aluminum nitride, silicon nitride, boron nitride, and the like. Examples of metal oxynitrides include lithium phosphorus oxynitride (LiPON), aluminum oxynitride, silicon oxynitride, boron oxynitride, and the like. Additional materials include glass, polymers, ceramics, and cermets (such as zirconium nitride, titanium nitride, hafnium nitride, tantalum nitride, niobium nitride, tungsten disilicide, titanium diboride, and zirconium diboride). Examples of glass that may be used as a barrier layer include amorphous types of glass such as silicon oxide, silicon nitrate, and the like. In some embodiments, one or more barrier layers also serve as an electrode conductor (e.g., as a conductor of electricity to the anode or cathode of a battery of cell). For example, a metal barrier layer may be electrically coupled to an anode to provide an electrical connection to the anode, or to a cathode to provide an electrical connection to the cathode. A barrier layer can be a component of a barrier structure. A barrier structure can include one or more layers of a barrier layer. For example, in some embodiments, a barrier structure can include one barrier layer and a smoothing layer. In some other embodiments, a barrier structure can include two or more barrier layers and a smoothing layer. In some embodiments, a barrier structure can include two or more barrier layers and two or more smoothing layers.

In some embodiments, the apparatus of the invention includes a getter layer. A getter layer is generally described in U.S. Pat. No. 5,654,084 and is a layer that is intended to react with or adsorb at least one component of a deleterious substance in the environment to assist in preventing penetration of the barrier layer by the deleterious substance. For example, a layer containing titanium, tantalum, phosphorous, barium, erbium, rubidium, a titanium-zirconium alloy, cobalt oxide, carbon, hydrazine, sodium sulfite, or the like can be used to reduce transport of water or oxygen through a barrier layer of an apparatus.

In some embodiments, an apparatus of the invention includes one or more capacitors formed through fabrication of two or more conductive layers separated by a dielectric, for example, a conductive layer that is electrically coupled to the cathode of the apparatus and a conductive layer that is electrically coupled to the anode of the invention that are separated by a dielectric material having a dielectric constant. The electrical characteristics of the capacitor can be controlled or varied by regulating the thickness of the dielectric material separating the conductive layers. For example, the capacitance of the capacitor is inversely correlated to the thickness of the dielectric material between the two conductive layers. Thus, capacitance can be increased by decreasing the thickness of the dielectric material between the two conductive layers. In order to form a high-quality capacitor, the dielectric layer should be uniformly thick and without gaps or pinholes that would allow the electrodes to have electrical contact, and thus a relatively smooth surface for depositing the layers of the capacitor is desirable. In some embodiments, a smoothing layer is deposited first in order to provide a suitable surface for depositing subsequently deposited layers of a capacitor. In some embodiments, photoresist can be used for the smoothing layer as well as a dielectric material.

The term intercalation as used herein refers to a property of a material that allows ions to readily move in and out of the material without the material changing its phase. Accordingly, a solid-state intercalation film remains in a solid state during discharging and charging of an energy-storage device.

FIG. 1A is a cross-sectional view of an apparatus 100A as built having an energy-storage device with an environmental barrier according to some embodiments of the invention. A substrate 110 is provided. Mechanically coupled to the substrate 110 is a cathode current collector 131 such as nickel (e.g., by being vacuum deposited as a film) on which a cathode 138 is electrically and mechanically coupled (e.g., by being vacuum deposited as a film). An electrolyte 135 is formed over the cathode 138 and continuously contacts the cathode current collector 131 and the substrate 110. An anode current collector 137 is formed above the cathode 138 with electrolyte 135 between the anode current collector 137 and the cathode 138. Also illustrated is an insulator layer 141, that, in some embodiments, acts as a smoothing layer, and that contacts (e.g., covers) the electrolyte 135, anode current collector 137, the cathode current collector 131 and the substrate 110. In some embodiments, an opening 148 is formed through the smoothing insulator layer 141 near or at the center of anode current collector 137, and a conductive diffusion barrier 142 is deposited. In some embodiments, this conductive diffusion barrier 142 forms an electrical conductor for anode current to anode contact 149. In some embodiments, diffusion barrier 142 completely covers the battery 101 that is formed by charging the device with electric current, and extends laterally a sufficient up to one millimeter beyond the edges of the components susceptable to environmental degradation, in some embodiments.

In some embodiments, a second smoothing layer 243 is deposited in contact with the anode current collector 137. In some embodiments, a barrier layer 244 that is also conductive is deposited in contact with the second smoothing layer 243 and in electrical contact with the cathode current collector 131. In some embodiments, an anode electrical contact area 149 and a cathode electrical contact area 249 are provided. In some embodiments, conductive layer 142, dielectric insulator 243 and conductive layer 244 form a capacitor that is electrically in parallel with the battery 101 that is formed as shown in FIG. 1B. In some embodiments, a diffusion barrier is also provided below battery 101

FIG. 1B is a cross-sectional view of an apparatus 100B that is substantially the same as 100A of FIG. 1A except that FIG. 1B shows apparatus 100B after the battery 101 is charged, which plates ions from cathode 138 through electrolyte 135 and onto the anode current collector 137 to form anode 136. The type of material that forms the anode 136 depends on the chemistry and type of battery 101 being formed. In some embodiments, lithium ions are used in apparatus 100B, and anode 136 as formed includes lithium metal. In some embodiments, a diffusion barrier is also provided below battery 101, either deposited on top of substrate 110 before the Battery layers are deposited, or on the bottom of substrate 110.

FIG. 1C is a schematic diagram 100C corresponding to apparatus 100B of FIG. 1B. Battery cell 101 is electrically connected in parallel with capacitor 102 formed by plates 142 and 244 that are separated by electrolyte 135. The capacitance value of capacitor 102 is a function of the area, thickness and dielectric constant of the dielectric 243 that separates the overlapping portion of plates 142 and 244 on either side of the dielectric.

FIG. 2A is a cross-sectional view of an apparatus 200A having an energy-storage device 101A with an environmental barrier 160 according to some embodiments of the present invention. A substrate 111 is provided. In some embodiments, substrate 111 includes a substrate base 110, a diffusion-barrier layer 121 and, in some embodiments, a dielectric or insulating layer 122 onto which is formed a conductor layer 130. In some embodiments, diffusion-barrier layer 121 includes an electrical conductor (e.g., a metal such as aluminum, gold, copper, molybdenum or other metal) and thus needs electrically insulating layer 122. In some embodiments, insulating layer 122 includes one or more materials such as silicon oxide, LiPON, aluminum oxide, polymer, or other suitable electrical insulator. In other embodiments, diffusion-barrier layer 121 is itself electrically insulating (for example, including an insulating silicon oxide, LiPON, silicon nitride, silicon oxynitride, boron nitride, ceramic, cermet, or other metal oxide, metal nitride, metal carbide, metal oxyboride, and/or metal oxynitride, wherein the metal is aluminum, indium, tin, indium-tin, zirconium, niobium, tantalum or other suitable metal), and optionally layer 122 is omitted. In some embodiments, substrate 111 is formed as part of the process described below, e.g., starting with a polymer film substrate base 110, and having deposited thereon one or more diffusion-barrier layers 121 alternated with one or more dielectric or insulating layers 122, or even a single electrically-insulating diffusion-barrier layer 121 alone.

Conductive layer 130 (e.g., aluminum or nickel) is sometimes deposited as separated areas or photodefined to be in two portions 130 and 132. In some embodiments, a cathode current collector 133, for example made of nickel, is then deposited. In some embodiments, a cathode material 138 such as $LiCoO_2$ is deposited on cathode current collector 133, and then covered with electrolyte material 135 (such as LiPON). In some embodiments, anode current collector 137 is deposited, and later anode material is plated through electrolyte 135 after the device/apparatus is sealed with one or more barrier structures 140. In some embodiments, barrier structure 140 is formed by depositing a smoothing layer 141 made of an insulating material such as photoresist, polyurethane, or other plastic, glass such as amorphous silicon oxide, silicon nitride or LiPON, or other suitable insulating and planarizing material. Then diffusion barrier 142 is deposited. The smoothing function of layer 141 helps provide a high-quality barrier layer 142 that is more difficult to achieve if the underlying layer is not smoothing. The edges of underlying structures and spits (pieces of debris from a sputtering operation), dust particles, and the like induce breaks and pinholes in the barrier structure, and the smoothing layer provides gentler slopes onto which the barrier can be deposited.

In some embodiments, the lateral extent of the anode 136 is approximately co-terminal with that of the cathode 138, as shown in FIG. 2A.

FIG. 2B is a cross-sectional view of an apparatus 200B that includes substantially the same structure as 200A of FIG. 2A, except that the anode and cathode are interchanged (positionally swapped). The cathode and the cathode contact are deposited after the anode and the anode contact. In some embodiments, the anode contact and the electrolyte are deposited, and then the anode is plated through the electrolyte onto the anode contact before depositing the cathode and subsequent layers. In some embodiments, this provides the advantage of being able to deposit the anode current collector, cover that with the LiPON electrolyte (which also acts as an oxygen-resistant protective layer), and then perform a pre-charging operation in a liquid solvent (such as propylene carbonate/$LiPF_6$ electrolyte solution) to plate a layer of lithium through the electrolyte/protective layer onto the anode current collector, and then deposit the remaining layers of the battery.

FIG. 1D is a cross-sectional view of an apparatus 190 used in some embodiments to plate lithium through a liquid electrolyte solution 191 and a solid permeable electrolyte protective layer 135 to form an anode 136. In some embodiments, plating apparatus 190 includes a closed container such as a glass jar 192 having a removable lid 193 that includes through-electrical connections 194. The left-hand electrical connection 194 is clipped to partially built device 201B that includes substrate 110, and anode contact 137 covered by solid electrolyte 135 (which is permeable to lithium ions). The right-hand electrical connection 194 is clipped to a sacrificial lithium counter electrode 195. Electrode 195 and device 201B are immersed in liquid electrolyte 191. An inert atmosphere 196 such as argon or dry nitrogen fills the rest of container 192.

In some embodiments, an anode layer 136 of lithium metal is formed on the copper anode contact 137 by electroplating in a liquid electrolyte 191, such as propylene carbonate/$LiPF_6$ electrolyte solution. The LiPON layer 135 is substantially not affected by immersion in the organic electrolyte solution 191, which is a lithium-ion conductor and an electrical insulator. The electrolytic properties allow Li+ transport from a sacrificial lithium electrode 195 through the electrolyte solution 191 and solid electrolyte 135, such that lithium metal only plates at the copper contact 137 under the LiPON layer 135. In some embodiments, the sacrificial lithium counter electrode 195 for plating is lithium metal. In some embodiments, electroplating is done at current densities between 0.6 $mA/cm^2$ and 1.2 $mA/cm^2$, and the voltage between the lithium metal counter electrode 195 and the lithium anode 136 (that is being plated underneath the LiPON on the micro-cell 201B) is about 40 mV at 0.6 mA. In some embodiments, plating is terminated after a suitable amount of current (e.g., 0.2 mA-hr of charge) is transferred. In some embodiments, the copper contact metal 137 turns to a shiny, silvery metallic after lithium metal 136 is plated.

In some embodiments, loading and unloading of the battery device 101 into the lithium plating apparatus 190 is carried out in a dry, nitrogen-purged glove-box to prevent corrosion of the counter electrode 195 and reduce moisture uptake in the electrolyte solvent 191. In some embodiments, the glove-box is used only to load the Cu/LiPON sample 201B, lithium metal foil 195, and electrolyte 191 into glass jar 192 that has sealed leads 194 to the electrodes. The jar 192 is purged (at least to some extent) by blowing argon into the top (in the nitrogen-filled glove-box) while quickly closing the lid 193. The jar apparatus 190 is then transferred to room-ambient conditions for connection to a power supply (such as an EG&G 273A potentiostat) that is used as an electrical-current source for plating. After plating lithium 136, the jar apparatus 190 is brought back into the glove-box to remove the plated sample 201B for further processing to deposit the subsequent layers. The sample 201B with lithium under the LiPON is then brought out to room-ambient conditions for finishing, for example by depositing a carbon/air cathode and subsequent testing. In some embodiments, although the relative humidity in the room could be forty-five percent relative humidity, the shiny metallic appearance of the electroplated lithium does not tarnish. The LiPON layer 135 provides protection from the rapid corrosion that would be otherwise expected in these conditions due to atmospheric oxygen and/or water vapor. In some embodiments, the residual electrolyte solution 191 is cleaned from the partially built cell 201B by rinsing in isopropyl alcohol and blowing dry with nitrogen.

In some embodiments, cathode 138 includes a carbon granule/polyfluoroacrylate air cathode coating. In some embodiments, to form such a carbon-air cathode 138, a slurry of graphite powder (for example, type Alpha Aesar, conducting, synthetic, −325 mesh) is made with a polyfluoroacrylate (for example, 3M Novec-1700 brand, having five percent solids) solution. In some embodiments, the solution is fifteen percent carbon by weight. The micro-cell 201B is dipped in the slurry and quickly removed. The Novec solution dries almost instantly leaving an adherent layer of carbon/polyfluoroacrylate on the LiPON separator. In some embodiments, the dipping procedure is repeated three or four times to get an opaque overcoat of the carbon/polyfluoroacrylate. In some embodiments, a cathode current collector is omitted. In other embodiments, a grid of conductive (e.g., copper) lines is deposited in order to allow subsequent wetting of the underlying device to activate it.

In some embodiments, such a carbon/polyfluoroacrylate air cathode 138 is activated by applying a drop of electrolyte solution (for example, propylene carbonate/$LiPF_6$). The solution penetrates the relatively open structure of the carbon/polyfluoroacrylate air cathode and also wets the surface of the LiPON electrolyte 135.

In some embodiments, the fabrication process for this hybrid, solid state/organic liquid electrolyte cell structure is scaled to deliver higher capacity cells. Manufacturing techniques to scale to amp-hour capacity are also realistic with the roll-to-roll, web deposition technique, as described in U.S. patent application Ser. No. 10/336,621 "APPARATUS AND METHOD FOR DEPOSITING MATERIAL ONTO A SUBSTRATE USING A ROLL-TO-ROLL MASK," filed Jan. 2, 2003, which is incorporated herein by reference. In some embodiments, the electroplating of lithium is performed in the roll-to-roll process, and the only vacuum-deposited materials are the anode contact metal and the LiPON separator. This greatly reduces problems with fabricating thick, vacuum-deposited layers in a web process.

FIG. 2C is a cross-sectional view of an apparatus 200C. In embodiments where electrode 2 is the anode and electrode 1 is the cathode, apparatus 200C is substantially the same as apparatus 200A shown in FIG. 2A, except that the anode 136 and anode contact 137 are deposited such that they extend laterally beyond the lateral terminus of the cathode 138 (to the right in FIG. 2C). In embodiments where electrode 1 is the anode and electrode 2 is the cathode, apparatus 200C is substantially the same as apparatus 200B shown in FIG. 2B, except that the cathode 138 and cathode contact are deposited such that they extend laterally beyond the lateral terminus of the anode 136 (to the right in FIG. 2C). The desirability of the configuration shown in FIG. 2C depends on the choice of cathode and/or anode material. In some embodiments, this configuration does not result from plating anode material 136 from cathode 138 following assembly, as described for FIG. 2A.

FIG. 2D is a cross-sectional view of an apparatus 200D that is formed by depositing an additional smoothing layer 243 and an additional barrier layer 244 onto device/apparatus 200A shown in FIG. 2A. In some embodiments, the additional barrier structure 240 formed by additional smoothing layer 243 and an additional barrier layer 244 provides additional barrier protection by the additional smoothing, additional barrier, and further because any pinholes that might have occurred in barrier 142 will often not be directly under pinholes that might occur in layer 244. This lateral offset between possible pinholes provides a lengthened lateral path length (sideways through the material of smoothing layer 243) that reduces the amount of detrimental substances that reach device 101A.

In some embodiments, multi-layer environmental barrier 240 includes a photoresist layer 141, aluminum (or other diffusion barrier) layer 142, another photoresist (or silicon oxide or other dielectric) layer 243, and another aluminum (or other diffusion barrier) layer 244. In some embodiments, a metal (e.g., aluminum) is used for layer 142 and the additional alternating layers of dielectric 243 and metal 244 are used to provide a functional circuit component, such as a capacitor, as well as providing additional diffusion barrier for the underlying components.

In some embodiments, an external electronic circuit is attached to the battery on substrate 111 as it is formed and shown in FIG. 12A described below (e.g., in some embodiments, the external electronic circuit is deposited as additional thin-film layers). In other embodiments, the circuit may be remote from the battery, for example, made separately and not attached to the battery as formed.

FIG. 2E is a cross-sectional view of an apparatus 200E that is formed by depositing an additional smoothing layer 243 and an additional barrier layer 244 onto device/apparatus 200B shown in FIG. 2B. This provides the additional advantages described above for the device 200D of FIG. 2D above.

FIG. 2F is a cross-sectional view of an apparatus 200F that is formed by depositing an additional smoothing layer 243 and an additional barrier layer 244 onto device/apparatus 200C shown in FIG. 2C. This provides the additional advantages described above for the device 200D of FIG. 2D.

In some embodiments, a device 101 (such as device 101A, 101B, or 101C, or a plurality of such devices) is deposited as a succession of thin-film layers deposited on substrate 111. In other embodiments, a device 101 is separately manufactured, and is attached (e.g., using adhesive, thermal bonding, ionic bonding, or other attachment technology) to substrate 111 once it is at least partially assembled.

In some embodiments, device 101 is surrounded by environmental barrier 160. In some embodiments, environmental barrier 160 includes a substrate-side barrier 120 (formed on the top side, bottom side, or both sides of substrate 110), and a cover barrier 140. In some embodiments, substrate 111 includes a substrate base 110 (which could be permeable to oxygen and/or water vapor), and thus needs a barrier 120, e.g., barrier layer 121 and/or insulating layer 122). In other embodiments, substrate base 110 is itself a barrier (e.g., a glass wafer, aluminum foil, or other material that forms a diffusion barrier), and in those cases substrate 111 includes only substrate base 110 (since it does not need a separate barrier layer 120), and such a substrate only needs cover barrier 140 to complete the environmental seal. In some embodiments, substrate base 110 possibly requires an insulating layer 122 if the substrate 110 is a conductor such as aluminum foil.

In the embodiment shown in FIG. 2B, device 200B includes a thin-film lithium battery 10B that includes conductor layer 130, which is separated, masked, deposited, or defined into two portions, viz. a cathode conductor layer 132 side-by-side to an anode conductor layer 131. In other embodiments, device 101 is any electrical component that can benefit from an environmental barrier 160. In some embodiments, conductor layers 131 and 132 are made of aluminum or copper, and act as conductors between the battery 101B and other components of a circuit. In some embodiments, one or more contact layers 139 are deposited, e.g., contact layer 133 and contact layer 134, to act as current collectors for the cathode 138 and anode 136, respectively. In other embodiments, the function of contact layers 133, 134, and/or 137 are provided by conductor layers 131 and 133, and separate layers 133, 134, and/or 137 are omitted.

In some embodiments, the cathode 138 includes lithium cobalt oxide (e.g., $LiCoO_2$). In some embodiments, electrolyte 135 includes lithium phosphorus oxynitride (LiPON). In some embodiments, anode 136 and/or anode contact 137 includes a layer made of, or including, copper, gold, aluminum, or other suitable metal, in order to improve conductivity. In some embodiments, one or more of these layers are deposited using an energy-assist mechanism (such as an ion-assist beam), as discussed in U.S. Pat. No. 6,805,998 entitled "METHOD AND APPARATUS FOR INTEGRATED-BATTERY DEVICES," U.S. patent application Ser. No. 09/816,602 and entitled "Device Enclosures with Integrated Batteries" filed Mar. 23, 2001, and U.S. patent application Ser. No. 09/815,884 entitled "Battery-Operated Wireless-Communication Apparatus and Method," filed Mar. 23, 2001, which are incorporated by reference.

In some embodiments, cover barrier 160 includes, for example, a physical-configuration layer 141 that includes photoresist material used to smooth and level over the areas being sealed (for example, over a solid-state lithium battery). In some such embodiments, the photoresist also provides a photodefinable mask function for itself, or over other areas of the device, for example, allowing conductive contacts to be selectively placed through the photoresist of layer 141 where desired, or allowing selective etching or ion removal of underlying layers. As for the diffusion-barrier layer 142, some embodiments use an aluminum metal material and/or a silicon-oxide material deposited on the photoresist of layer 141.

FIG. 3A is a cross-sectional view of an apparatus 300A that includes an energy-storage device with a planarized environmental barrier part way through the process of being made. In these embodiments, definable layer 341 is deposited, and then planarized to plane 349 (for example, by chemical-mechanical polishing (CMP)). Layer 341 is deposited relatively thickly, such that when it is planarized, all of device 101A is below plane 349, and all material above plane 349 is removed. Device 101A is as described above for FIG. 2A. After material has been removed to plane 349 of FIG. 3A, one or more barrier structures are added, such as shown in FIG. 4A.

FIG. 4A is a cross-sectional view of an apparatus 400A that includes an energy-storage device with a planarized environmental barrier 440 later in the process of being made. In these embodiments, multi-layer environmental barrier 440 includes a planarized photoresist layer 341, aluminum (or other diffusion barrier) layer 442, another photoresist (or silicon oxide, LiPON, or other dielectric) layer 443, and another aluminum (or other diffusion barrier) layer 444. In some embodiments, a metal (e.g., aluminum) is used for layer 442 and the additional alternating layers of dielectric 443 and metal 444 are used to provide a functional circuit component, such as a capacitor, as well as providing additional diffusion barrier for the underlying components.

FIG. 3B is a cross-sectional view of an apparatus 300B that includes an energy-storage device with a planarized environmental barrier part way through the process of being made. In these embodiments, definable layer 341 is deposited, and then planarized to plane 349 (for example, by chemical-mechanical polishing (CMP)). Layer 341 is deposited relatively thickly, such that when it is planarized, all of device 101B is below plane 349, and all material above plane 349 is removed. Device 101B is as described above for FIG. 2B. After material has been removed to plane 349 of FIG. 3B, one or more barrier structures are added, such as shown in FIG. 4B.

FIG. 4B is a cross-sectional view of an apparatus 400B that includes an energy-storage device with a planarized environmental barrier 440 later in the process of being made. In these embodiments, multi-layer environmental barrier 440 is as described for FIG. 4A above.

FIG. 3C is a cross-sectional view of an apparatus 300C that includes an energy-storage device with a planarized environmental barrier part way through the process of being made. In these embodiments, definable layer 341 is deposited, and then planarized to plane 349 (for example, by chemical-mechanical polishing (CMP)). Layer 341 is deposited relatively thickly, such that when it is planarized, all of device 101C is below plane 349, and all material above plane 349 is removed. Device 101C is as described above for FIG. 2B. After material has been removed to plane 349 of FIG. 3C, one or more barrier structures are added, such as shown in FIG. 4C.

FIG. 4C is a cross-sectional view of an apparatus 400C that includes an energy-storage device with a planarized environmental barrier 440 later in the process of being made. In these embodiments, multi-layer environmental barrier 440 is as described for FIG. 4A above.

FIG. 5A is a cross-sectional view of an apparatus 500A that includes an energy-storage device with an environmental barrier that includes a photodefinable portion, later in the process of being fabricated after FIG. 4A. In these embodiments, definable layer 141 is formed with an opening 505. For example, in some embodiments, layer 141 is a photoresist material that is selectively exposed to an energy source (such as light or an electron beam), then developed to form opening 505. In other embodiments, the material for layer 141 is deposited (such as by a spray or vapor deposition) through a mask or stencil that prevents deposition of material at opening 505. The lower portions of device 500A are as described for FIG. 2A above.

FIG. 6A a cross-sectional view of an apparatus 600A that includes an energy-storage device with an environmental barrier that includes a photodefinable portion, later in the process of being made. In some embodiments, a metal (e.g., aluminum, copper, or gold or other suitable metal or metal alloy or metal ceramic) is used for diffusion-barrier layer 642. Metal 642 is also used to provide a functional circuit component, contacting the underlying conductive layer 131 at 605 through the photoresist 141 opening at 505. The lower portions of device 600A are as described for FIG. 5A above, with the addition of layer 642.

FIG. 5B is a cross-sectional view of an apparatus 500B that includes an energy-storage device with an environmental barrier that includes a photodefinable portion, later in the process of being fabricated after FIG. 4B. In these embodiments, definable layer 141 is formed with an opening 505. For example, in some embodiments, layer 141 is a photoresist material that is selectively exposed to an energy source (such as light), then developed to form opening 505. In other embodiments, the material for layer 141 is deposited (such as by a spray or vapor deposition) through a mask or stencil that prevents deposition of material at opening 505. The lower portions of device 500B are as described for FIG. 2B above.

FIG. 6B a cross-sectional view of an apparatus 600B that includes an energy-storage device with an environmental barrier that includes a photodefinable portion, later in the process of being made. In some embodiments, a metal (e.g., aluminum, copper, or gold or other suitable metal or metal alloy or metal ceramic) is used for diffusion-barrier layer 642. Metal 642 is also used to provide a functional circuit component, contacting the underlying conductive layer 131 at 605 through the photoresist 141 opening at 505. The lower portions of device 600B are as described for FIG. 5B above, with the addition of layer 642.

FIG. 5C is a cross-sectional view of an apparatus 500C that includes an energy-storage device with an environmental barrier that includes a photodefinable portion, later in the process of being fabricated after FIG. 4C. In these embodiments, definable layer 141 is formed with an opening 505. For example, in some embodiments, layer 141 is a photoresist material that is selectively exposed to an energy source (such as light), then developed to form opening 505. In other embodiments, the material for layer 141 is deposited (such as by a spray or vapor deposition) through a mask or stencil that prevents deposition of material at opening 505. The lower portions of device 500C are as described for FIG. 2C above.

FIG. 6C a cross-sectional view of an apparatus 600C that includes an energy-storage device with an environmental barrier that includes a photodefinable portion, later in the process of being made. In some embodiments, a metal (e.g., aluminum, copper, or gold or other suitable metal or metal alloy or metal ceramic) is used for diffusion-barrier layer 642. Metal 642 is also used to provide a functional circuit component, contacting the underlying conductive layer 131 at 605 through the photoresist 141 opening at 505. The lower portions of device 600C are as described for FIG. 5C above.

FIG. 7C is a cross-sectional view of an apparatus 700C that includes an energy-storage device with an environmental barrier that includes a photodefinable portion 141 (on the left side of FIG. 7C), still later in the process of being made. In these embodiments, definable layer 743 is formed with an opening 705 (on the right side of FIG. 7A). For example, in some embodiments, layer 743 is a photoresist material that is selectively exposed to an energy source (such as light), then developed to form opening 705. In other embodiments, the material for layer 743 is deposited (such as by a spray or vapor deposition) through a mask or stencil that prevents deposition of material at opening 705. The lower portions of device 700C are as described for FIG. 6C above, with the addition of layer 743.

FIG. 8A is a cross-sectional view of an apparatus 800A that includes an energy-storage device with an environmental barrier that includes a photodefinable portions 743 and 846, yet later in the process of being made. In some such embodiments, metal layer 642 and photoresist layer 141 were removed by a process such as etching from the definable opening 705 in photoresist layer 743. Definable layer 846 is later formed with an opening 805. For example, in some embodiments, layer 846 is a photoresist material that is selectively exposed to an energy source (such as light), then developed to form opening 805. In other embodiments, the material for layer 846 is deposited (such as by a spray or vapor deposition) through a mask or stencil that prevents deposition of material at opening 805. The lower portions of device 800A are as described for FIG. 7A above, after etching or otherwise removing the material at opening 705, adding layer 846, and removing material from opening 805.

FIG. 7B is a cross-sectional view of an apparatus 700B that includes an energy-storage device with an environmental barrier that includes a photodefinable portion 141 (on the left side of FIG. 7B), still later in the process of being made. In these embodiments, definable layer 743 is formed with an opening 705 (on the right side of FIG. 7B). For example, in some embodiments, layer 743 is a photoresist material that is selectively exposed to an energy source (such as light), then developed to form opening 705. In other embodiments, the material for layer 743 is deposited (such as by a spray or vapor deposition) through a mask or stencil that prevents deposition of material at opening 705. The lower portions of device 700B are as described for FIG. 6B above.

FIG. 8B is a cross-sectional view of an apparatus 800B that includes an energy-storage device with an environmental barrier that includes a photodefinable portions 743 and 846, yet later in the process of being made. In some such embodiments, metal layer 642 and photoresist layer 141 were removed by a process such as etching from the definable opening 705 in photoresist layer 743. Definable layer 846 is later formed with an opening 805. For example, in some embodiments, layer 846 is a photoresist material that is selectively exposed to an energy source (such as light), then developed to form opening 805. In other embodiments, the material for layer 846 is deposited (such as by a spray or vapor deposition) through a mask or stencil that prevents deposition of material at opening 805. The lower portions of device 800B are as described for FIG. 7B above, after etching or otherwise removing the material at opening 705, adding layer 846, and removing material from opening 805.

FIG. 7C is a cross-sectional view of an apparatus 700C that includes an energy-storage device with an environmental barrier that includes a photodefinable portion 141 (on the left side of FIG. 7C), still later in the process of being made. In these embodiments, definable layer 743 is formed with an opening 705 (on the right side of FIG. 7C). For example, in some embodiments, layer 743 is a photoresist material that is selectively exposed to an energy source (such as light), then developed to form opening 705. In other embodiments, the material for layer 743 is deposited (such as by a spray or vapor deposition) through a mask or stencil that prevents deposition of material at opening 705. The lower portions of device 700C are as described for FIG. 6C above.

FIG. 8C is a cross-sectional view of an apparatus 800C that includes an energy-storage device with an environmental barrier that includes a photodefinable portions 743 and 846, yet later in the process of being made. In some such embodiments, metal layer 642 and photoresist layer 141 were removed by a process such as etching from the definable opening 705 in photoresist layer 743. Definable layer 846 is later formed with an opening 805. For example, in some embodiments, layer 846 is a photoresist material that is selectively exposed to an energy source (such as light), then developed to form opening 805. In other embodiments, the material for layer 846 is deposited (such as by a spray or vapor deposition) through a mask or stencil that prevents deposition of material at opening 805. The lower portions of device 800C are as described for FIG. 7C above, after etching or otherwise removing the material at opening 705, adding layer 846, and removing material from opening 805.

FIG. 9A is a cross-sectional view of an apparatus 900A that includes an energy-storage device with an environmental barrier that includes a photodefinable portion, yet later in the process of being made. In these embodiments, a metal (e.g., aluminum) is used for diffusion-barrier layer 947. Metal 947 is also used to provide a functional circuit component, contacting the underlying conductive layer 132 at 905 through the photoresist 846 opening at 805. In some embodiments, definable photoresist layer 948 is later applied over the conductive layer 947. The lower portions of device 900A are as described for FIG. 8A above, with two more layers 947 and 948 added.

FIG. 10A is a cross-sectional view of an apparatus 1000A that includes an energy-storage device with an environmental barrier that includes a photodefinable portion, yet later in the process of being made. In some such embodiments, definable photoresist layer 948 has been removed to expose openings at 1003 and 1004. Definable photoresist layer 1049 is then applied with openings at 1004 and 1005. Opening 1006 exposes metal layer 642 for external connection. Opening 1007 exposes metal layer 947 for external connection. The lower portions of device 1000A are as described for FIG. 9A above, with the addition of layers 1049, and the removal of material for openings 1003, 1004 first, and removal of material for opening 1005 at a later time.

FIG. 9B is a cross-sectional view of an apparatus 900B that includes an energy-storage device with an environmental barrier that includes a photodefinable portion, yet later in the process of being made. (See the description of FIG. 9A) The lower portions of device 900B are as described for FIG. 8B above, with two more layers 947 and 948 added.

FIG. 10B is a cross-sectional view of an apparatus 1000B that includes an energy-storage device with an environmental barrier that includes a photodefinable portion, yet later in the process of being made. (See the description of FIG. 10A) The lower portions of device 1000B are as described for FIG. 9B above, with the addition of layers 1049, and the removal of material for openings 1003, 1004 first, and removal of material for opening 1005 at a later time.

FIG. 9C is a cross-sectional view of an apparatus 900C that includes an energy-storage device with an environmental barrier that includes a photodefinable portion, yet later in the process of being made. (See the description of FIG. 9A) The lower portions of device 900C are as described for FIG. 8C above, with two more layers 947 and 948 added.

FIG. 10C is a cross-sectional view of an apparatus 1000C that includes an energy-storage device with an environmental barrier that includes a photodefinable portion, yet later in the process of being made. (See the description of FIG. 10A) The lower portions of device 1000C are as described for FIG. 9C above, with the addition of layers 1049, and the removal of material for openings 1003, 1004 first, and removal of material for opening 1005 at a later time.

FIG. 11 is a cross-sectional and perspective view of a generic device 101 with an environmental barrier structure 140 on substrate 111. As described above, barrier structure 140 includes a smoothing layer 141 and a diffusion barrier layer 142.

FIG. 12A is a cross-sectional view of an apparatus 1200 having a device 101 (such as a thin-film lithium battery) with an environmental barrier structure 140. In some embodiments, barrier structure 140 includes a conductive layer 142 that is patterned into an electrical component 1201, such as a spiral inductive coil 1201 as shown. In some embodiments, further barrier structure layers (smoothing layer 243 and diffusion barrier 244 together with the first diffusion barrier layer 142 form a capacitor 1202. In some embodiments, capacitor 1202 is in parallel with battery 101, thus providing a source of surge current that exceeds the capacity of battery 101 to supply such current. In some embodiments, inductor 1201 is fabricated to be connected in series with battery 101. In other embodiments, other electrical components can be fabricated using portions of one or more of the barrier layers FIG. 12B is a schematic circuit diagram of apparatus 1200 of FIG. 12A. In this embodiment, device 101 is a thin-film lithium battery, and capacitor 1202 is wired in parallel with the battery 101, and inductor 1201 is wired in series with the battery 101 and capacitor 1202.

FIG. 13 is a perspective exploded view of information-processing system 1300 (such as a lap-top computer) using energy-storage device 1330. For example, in various exemplary embodiments, information-processing system 1300 embodies a computer, workstation, server, supercomputer, cell phone, automobile, washing machine, multimedia entertainment system, or other device. In some embodiments, packaged circuit 1320 includes a computer processor that is connected to memory 1321, power supply (energy-storage device 1330), input system 1312 (such as a keyboard, mouse, and/or voice-recognition apparatus), input-output system 1313 (such as a CD or DVD read and/or write apparatus), input-output system 1314 (such as a diskette read/write apparatus), output system 1311 (such as a display, printer, and/or audio output apparatus), wireless communication antenna 1340, and packaged within enclosure having a top shell 1310, middle shell 1315, and bottom shell 1316. In some embodiments, energy-storage device 1330 is deposited as film layers directly on and substantially covering one or more surfaces of the enclosure (i.e., top shell 1310, middle shell 1315, and/or bottom shell 1316).

FIG. 14 shows an information-processing system 1400 having a similar configuration to that of FIG. 13. In various exemplary embodiments, information-processing system 1400 embodies a pocket computer, personal digital assistant (PDA) or organizer, pager, Blackberry™-type unit, cell phone, GPS system, digital camera, MP3 player-type entertainment system, and/or other device. In some embodiments, packaged circuit 1420 includes a computer processor that is connected to memory 1421, power supply 1430, input system 1412 (such as a keyboard, joystick, and/or voice-recognition apparatus), input/output system 1414 (such as a portable memory card connection or external interface), output system 1411 (such as a display, printer, and/or audio output apparatus), wireless communication antenna 1440, and packaged within enclosure having a top shell 1410 and bottom shell 1416. In some embodiments, energy-storage device 1430 is deposited as film layers directly on and substantially covering one or more surfaces of the enclosure (i.e., top shell 1410 and/or bottom shell 1416).

FIG. 15 shows an information-processing system 1500. For example, in various exemplary embodiments, information-processing system 1500 embodies a wearable computer, smart identification card, credit card, identification card, RFID sticker, mini-MP3-player type multimedia entertainment system, or other device. In some embodiments, packaged circuit 1520 includes a computer processor that is connected to memory 1521, power supply 1530, wireless communication antenna 1540, and packaged within enclosure 1510.

FIG. 16 is a schematic of a roll-to-roll apparatus or process 1600 that deposits a smoothing layer 1641 using a doctor blade 1622 and then photo-defines the extent of the smoothing layer. In some embodiments, a source roll 1601 provides substrate 110, onto which device-former apparatus 1610 deposits a plurality of devices 110. In some embodiments, the smoothing layer 1641 is "squeegeed" and/or doctor-bladed in place onto devices 101 on a roll-to-roll substrate 110. For example, in some embodiments, a smoothing material and/or solvent mix 1625 is spread across the substrate 110 at smoothing deposition station 1620 using a fairly soft squeegee or spatula 1621, then leveled using a doctor-blade assembly 1622, as is well known in the printing and engraving art. This leaves leveling material 1641 across the surface of substrate 110 and the devices 110 that are affixed to it. In some embodiments, the deposited smoothing material is later photo defined to limit its lateral extent (i.e., define outside boundaries and any openings in each deposition). For example, photo-definition station 1630 exposes a pattern of light through mask 1631 defining where the smoothing layer 141 is to be left. Developer station 1640 removes the smoothing material 1641 everywhere else. Barrier deposition station 1650 deposits barrier layer 142. In some embodiments, further smoothing layers and/or barrier layers are then deposited, and the resulting product is taken up by roller 1602.

FIG. 17 is a schematic of a roll-to-roll apparatus or process 1700 that deposits a smoothing layer using an offset press that defines the extent of the smoothing layer. In some embodiments, the smoothing layer 141 is deposited by an apparatus 1700 that is essentially an offset printing press, wherein a smoothing material and/or solvent mix ("ink") 1625 is spread across an offset printing plate 1721 (having troughs or depressions 1722 where the material 1625 is desired) using a fairly soft squeegee or spatula 1621, then leveled using a doctor-blade assembly 1622, and this printing plate 1721 is then pressed against the device 101 being fabricated (e.g., in some embodiments, the plate 1721 is formed into a cylinder that is rolled against the device substrate) to transfer the smoothing material and/or solvent mix 1641 from the troughs 1722 on the printing plate 1721 to the areas to which the smoothing layer 141 is desired. In some embodiments, smoothing material and/or solvent mix 1641 is dried to remove the solvent and leave smoothing layer 141 where it is desired. In these embodiments, the pattern on the printing plate defines the lateral extent of the smoothing layer. Barrier deposition station 1650 deposits barrier layer 142. In some embodiments, further smoothing layers and/or barrier layers are then deposited, and the resulting product is taken up by roller 1602.

Lithium solid-state battery technology is highly sensitive to components of the air, including $O_2$, $H_2O$ vapor, $N_2$, and/or $CO_2$. In order for the battery to function for extended times in any environment, a barrier that prevents the transmission of reactive species outside of the battery to the active battery materials is employed. Layered structures, including one or more pairs of layers, each pair including a layer of one or more materials including organic polymer, glass, and/or semi-solid material, and a layer of one or more metal, ceramic, and/or other material with low gas-transmission rates (e.g., less than 0.1 ml gas per square meter per day) are effective in reducing gas transmission to levels below the detection limits of transmission-rate-determining instrumentation. In the case of $O_2$ and water vapor, these detection limits are typically 0.005 mL $O_2$ per square meter per day, and 0.005 g $H_2O$ per square meter per day. The inventors have determined that transmission rates of less than 0.001 mL $O_2$ per square meter per day and less than 0.00005 g $H_2O$ per square meter per day are useful, in some embodiments, for solid-state batteries to meet long term commercial acceptance.

The function of the organic polymer, glass, or semi-solid in the physical-configuration layer is to provide a smooth surface onto which the material with low gas-transmission rates is applied, and to remove defects or smoothing problems in surface morphology from previous layers that may induce defects in subsequent layers. The uses and advantages of using photo-definable materials in the layered structures are described. A device that includes solid-state batteries and/or other electronic components will require electrical-connection access to the device, and hence some contact pads may not be completely covered with any layer or the barrier structure. Organic polymer, glass, or semi-solid layers that may be patterned by either exposure to, or shielding from, electromagnetic radiation (or other energy sources) are advantageous over other materials, in that access to contact pads and other patterning is easily accomplished without compromising the quality of the barrier.

The concept has been reduced to practice. A layered structure having 1.2 micrometer Al, spin-on photoresist (Shipley 1813, 3000 rpm spin on, exposed under a "trouble lamp," cured at 170 degrees C. for 15 minutes), 1.2 micrometer Al was deposited onto a two-mil (about 50 micrometer) polyimide film. When evaluated at Mocon (an evaluation company), the water-vapor transmission rate at 50 degrees C., and one-hundred percent relative humidity was below the detection limit of the instrument (0.005 g $H_2O$ per square meter per day).

One aspect of some embodiments the present invention provides a device having a thin-film battery and an environmental barrier having a definable lateral extent.

Some embodiments include an apparatus that includes a substrate, a first device attached to the substrate, and a layered barrier structure that seals the first device, wherein the layered barrier structure includes a first physical-configuration layer having a definable lateral extent, and wherein the layered barrier structure also includes a first barrier layer.

In some embodiments, the first physical-configuration layer has a lateral extent that is photodefinable.

In some embodiments, the first physical-configuration layer is photoresist and the first barrier layer is aluminum.

In some embodiments, the first physical-configuration layer includes an organic polymer.

In some embodiments, the first physical-configuration layer includes glass.

In some embodiments, the first physical-configuration layer includes a semi-solid layer.

Some embodiments further include a photo-definable barrier layer. In some embodiments, at least one photo-definable barrier layer is deposited between the device and the substrate. In some embodiments, the photo-definable barrier layer is deposited on the substrate, and the device is deposited thereafter. In some embodiments, the photo-definable barrier layer is deposited on the device, and the result is deposited onto the substrate. In some embodiments, the photo-definable layer is deposited on the substrate such that the substrate is located between the device and the photo definable layer. In some embodiments, a barrier layer is deposited on the photo-definable layer.

In some embodiments, the apparatus further includes a substrate barrier structure between the device and the substrate. In some embodiments, the substrate barrier structure includes a photo-definable layer. In some embodiments, the substrate barrier structure includes an aluminum diffusion barrier.

In some embodiments, the first device includes a thin-film lithium battery, and the first physical-configuration layer that is laterally limited and covers at least the battery.

In some embodiments, the first barrier layer includes a metal (such as, for example, aluminum, gold, copper, iron and combinations thereof).

In some embodiments, the first barrier layer includes aluminum.

In some embodiments, the first barrier layer includes a ceramic material.

In some embodiments, the first barrier layer also has a defined lateral extent. In some such embodiments, the first device includes a thin-film lithium battery, and the first barrier layer includes a gas barrier layer that is laterally limited but covers at least the battery. In some such embodiments, the first barrier layer is photodefined. In some such embodiments, the first barrier layer provides a circuit-wiring function.

In some embodiments, the barrier layer includes a material having a low gas-transmission rate.

In some embodiments, wherein the layered barrier structure further includes a second physical-configuration layer covering the first barrier layer and a second barrier layer covering the second physical-configuration layer. In some such embodiments, the first physical-configuration layer includes photoresist, the first barrier layer includes aluminum, the second physical-configuration layer includes photoresist, and the second barrier layer includes aluminum. In some such embodiments, the second physical-configuration layer has a lateral extent that is photodefined. In some such embodiments, the first barrier layer and the second barrier layer are connected as a capacitor to a circuit. Some embodiments further include a plurality of alternating physical-configuration layers and barrier layers having defined lateral extents. In some embodiments, at least some layers of the plurality of defined alternating layers are electrically connected to an electrical circuit that includes a lithium battery, and wherein the first device sealed by the layered barrier structure includes the lithium battery. In some embodiments, at least some layers of the plurality of defined alternating layers are connected to form a passive component of an electrical circuit, and wherein the device also forms a portion of the electrical circuit.

Some embodiments further include a second device attached to the substrate and covered by the layered barrier structure, wherein the layered barrier structure includes a plurality of defined alternating layers are connected to form a passive component of an electrical circuit, and wherein the first and second devices also form portions of the electrical circuit.

In some embodiments, the first physical-configuration layer is photoresist.

In some embodiments, the device includes a thin-film lithium battery, and the first physical-configuration photoresist layer is laterally limited using photolithography to cover at least the battery.

In some embodiments, the first barrier layer forms a circuit-wiring layer.

In some embodiments, the first barrier layer includes metal covering the first physical-configuration photoresist layer. In some such embodiments, the layered barrier structure further includes a second photoresist layer covering the first barrier metal layer and a second metal layer covering the second photoresist layer, wherein the first metal layer and the second metal layer are connected as a capacitor to a circuit of the device.

In some embodiments, the device includes a battery, and the apparatus further includes a circuit electrically coupled to the battery, wherein the circuit includes a processor, a memory, and an input device and an output device. In some such embodiments, the circuit further includes an antenna.

Some embodiments of the invention include an apparatus that has a substrate, a first device attached to the substrate, and means as described herein (and interpreted under 35 U.S.C. section 112 paragraph 6) for sealing the first device, including means for physically configuring a surface of the device, the means for physically configuring the surface of the device having a definable lateral extent, and means for blocking gas, deposited on the means for physically configuring the surface of the device.

In some embodiments, the means for physically configuring the surface of the device has a lateral extent that is photodefined.

In some embodiments, the means for physically configuring the surface of the device includes photoresist and the means for blocking gas includes aluminum.

In some embodiments, the means for physically configuring the surface of the device includes an organic polymer.

In some embodiments, the means for physically configuring the surface of the device includes glass.

In some embodiments, the means for physically configuring the surface of the device includes a semi-solid layer.

In some embodiments, a lateral extent of means for physically configuring the surface of the device is photodefined, wherein the first device attached to the substrate includes a deposited thin-film lithium battery having successive layers deposited on the substrate, and wherein the means for physically configuring the surface of the device is photodefined to cover at least the battery.

In some embodiments, the means for blocking gas includes a metal.

In some embodiments, the means for blocking gas includes aluminum.

In some embodiments, the means for blocking gas includes a ceramic material.

Other aspects of some embodiments include a method that includes providing a substrate having a first device attached to the substrate, and forming a layered barrier structure that seals the first device, wherein the forming of the layered barrier structure includes: depositing a first physical-configuration layer having a definable lateral extent, and depositing a first barrier layer.

Some embodiments of the method further include photo-defining a lateral extent of the first physical-configuration layer.

In some embodiments, the depositing of the first physical-configuration layer includes depositing photoresist and the depositing of the first barrier layer includes depositing aluminum.

In some embodiments, the depositing of the first physical-configuration layer includes depositing an organic polymer.

In some embodiments, the depositing of the first physical-configuration layer includes depositing glass.

In some embodiments, the depositing of the first physical-configuration layer includes depositing a semi-solid layer.

Some embodiments of the method further include photo-defining a lateral extent of the first physical-configuration layer, wherein the providing of the substrate having the first device attached to the substrate further includes depositing a thin-film lithium battery in successive layers on the substrate, and wherein the first physical-configuration layer is photodefined to cover at least the battery.

In some embodiments, the depositing of the first barrier layer includes depositing a metal.

In some embodiments, the depositing of the first barrier layer includes depositing aluminum.

In some embodiments, the depositing of the first barrier layer includes depositing a ceramic material.

In some embodiments, the forming of the layered barrier structure also includes defining a lateral extent of the first barrier layer.

In some embodiments, the forming of the layered barrier structure also includes etching a lateral extent of the first barrier layer.

In some embodiments, the forming of the layered barrier structure also includes masking a lateral extent of the first barrier layer during the depositing of the first barrier layer. In some such embodiments, the providing of the substrate having the first device attached to the substrate further includes depositing a thin-film lithium battery in successive layers on the substrate, and wherein the depositing of the first barrier layer includes depositing a gas barrier layer that is laterally limited but covers at least the battery.

Some embodiments of the method further include photo-defining the first barrier layer. In some such embodiments, the photodefining of the first barrier layer includes photodefining a circuit-wiring function.

In some embodiments, depositing of the barrier layer includes depositing a material having a low gas-transmission rate.

In some embodiments, the forming of the layered barrier structure further includes depositing a second physical-configuration layer on the first barrier layer and depositing a second barrier layer on the second physical-configuration layer.

In some embodiments, the depositing of the first physical-configuration layer includes depositing photoresist, the depositing of the first barrier layer includes depositing aluminum, the depositing of the second physical-configuration layer includes depositing photoresist, and the depositing of the second barrier layer includes depositing aluminum.

Some embodiments of the method further include photo-defining a lateral extent of the second physical-configuration layer.

In some embodiments, the first barrier layer and the second barrier layer are connected as a capacitor to a circuit.

Some embodiments of the method further include a plurality of alternating physical-configuration layers and barrier layers having defined lateral extents.

In some embodiments, at least some layers of the plurality of defined alternating layers are electrically connected to an electrical circuit that includes a lithium battery, and wherein the first device sealed by the layered barrier structure includes the lithium battery.

In some embodiments, at least some layers of the defined alternating layers are connected to form a passive component of an electrical circuit, and wherein the device also forms a portion of the electrical circuit.

Some embodiments further include attaching a second device to the substrate and connecting a plurality of defined alternating layers of the layered barrier structure to form a passive component of an electrical circuit, and connecting the first and second devices to form portions of the electrical circuit.

In some embodiments, the first physical-configuration layer is photoresist.

In some embodiments, the device includes a thin-film lithium battery, and the first physical-configuration photoresist layer is laterally limited using photolithography to cover at least the battery.

In some embodiments, the first barrier layer forms a circuit-wiring layer.

In some embodiments, the first barrier layer includes metal covering the first physical-configuration photoresist layer.

In some embodiments, the layered barrier structure further includes a second photoresist layer covering the first barrier metal layer and a second metal layer covering the second photoresist layer, wherein the first metal layer and the second metal layer are connected as a capacitor to a circuit of the device.

In some embodiments, the device includes a battery, the method further comprising electrically coupling a circuit to the battery, wherein the circuit includes a processor, a memory, and an input device and an output device.

In some embodiments, the circuit further includes an antenna.

Some embodiments of the method further include depositing a substrate photo-definable barrier layer such that the substrate photo-definable barrier layer is on an opposite side of the device from the first layered barrier structure.

Some embodiments of the method further include depositing the photo-definable barrier layer between the device and the substrate.

Some embodiments of the method further include depositing the photo-definable barrier layer on the substrate.

Some embodiments of the method further include depositing the photo-definable barrier layer on the device.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

We claim:

1. An apparatus comprising:
   a substrate;
   a first device attached to the substrate; and
   a layered barrier structure that has a plurality of layers and that seals the first device, wherein the layered barrier structure includes a first physical-configuration layer made of a photodefinable material having a definable lateral extent that is photodefined after being deposited, and wherein at least one of the layers provides at least one of a smoothing, planarizing, and leveling physical-configuration function, and wherein the layered barrier structure includes a first barrier layer deposited on the first physical configuration layer.

2. An apparatus comprising:
   a substrate;
   a first device attached to the substrate; and
   a layered barrier structure that seals the first device, wherein the layered barrier structure includes a first physical-configuration layer made of a photodefinable material having a definable lateral extent, and wherein the layered barrier structure includes a first barrier layer, wherein the first physical-configuration layer has a lateral extent that is photodefinable.

3. The apparatus of claim 2, wherein the device includes a thin-film battery, and the first physical-configuration layer is deposited using a doctor-blade process.

4. The apparatus of claim 1, wherein the first physical-configuration layer is photoresist and the first barrier layer is aluminum.

5. The apparatus of claim 1, further comprising a substrate barrier structure between the device and the substrate.

6. The apparatus of claim 5, wherein the substrate barrier structure includes a photo-definable layer.

7. The apparatus of claim 6, wherein the substrate barrier structure includes an aluminum diffusion barrier.

8. The apparatus of claim 1, wherein the first device includes a thin-film lithium battery, and the first physical-configuration layer that is laterally limited and covers at least the battery.

9. The apparatus of claim 1, wherein the first barrier layer includes a metal.

10. The apparatus of claim 1, wherein the first barrier layer includes aluminum.

11. The apparatus of claim 1, wherein the first barrier layer includes a ceramic material.

12. The apparatus of claim 1, wherein the first barrier layer also has a definable lateral extent.

13. The apparatus of claim 12, wherein the first device includes a thin-film lithium battery, and the first barrier layer includes a gas barrier layer that is laterally limited but covers at least the battery.

14. The apparatus of claim 12, wherein the first barrier layer is photodefined.

15. The apparatus of claim 14, wherein the first barrier layer provides a circuit-wiring function.

16. The apparatus of claim 1, wherein the barrier layer includes a material having a gas-transmission rate of less than 0.1 ml gas per square meter per day.

17. The apparatus of claim 1, wherein the layered barrier structure further includes a second physical-configuration layer covering the first barrier layer and a second barrier layer covering the second physical-configuration layer.

18. The apparatus of claim 17, wherein
   the first physical-configuration layer includes photoresist;
   the first barrier layer includes aluminum;
   the second physical-configuration layer includes photoresist; and
   the second barrier layer includes aluminum.

19. The apparatus of claim 18, wherein the second physical-configuration layer has a lateral extent that is photodefined.

20. The apparatus of claim 18, wherein the first barrier layer and the second barrier layer are connected as a capacitor to a circuit.

21. The apparatus of claim 17, further comprising a plurality of alternating physical-configuration layers and barrier layers having defined lateral extents.

22. The apparatus of claim 21, wherein at least one of the plurality of defined alternating layers are electrically connected to an electrical circuit that includes a lithium battery, and wherein the first device sealed by the layered barrier structure includes the lithium battery.

23. The apparatus of claim 21, wherein the plurality of defined alternating layers are connected to form a passive component of an electrical circuit, and wherein the device also forms a portion of the electrical circuit.

24. The apparatus of claim 1, further comprising:
   a second device attached to the substrate and covered by the layered barrier structure, wherein the layered barrier structure includes a plurality of defined alternating layers are connected to form a passive component of an electrical circuit, and wherein the first and second devices also form portions of the electrical circuit.

25. The apparatus of claim 1, wherein the first physical-configuration layer is photoresist.

26. The apparatus of claim 25, wherein the device includes a thin-film lithium battery, and the first physical-configuration photoresist layer is laterally limited using photolithography to cover at least the battery.

27. The apparatus of claim 26, wherein the first barrier layer forms a circuit-wiring layer.

28. The apparatus of claim 25, wherein the first barrier layer includes metal covering the first physical-configuration photoresist layer.

29. The apparatus of claim 28, wherein the layered barrier structure further includes a second photoresist layer covering the first barrier metal layer and a second metal layer covering the second photoresist layer, wherein the first metal layer and the second metal layer are connected as a capacitor to a circuit of the device.

30. The apparatus of claim 1, wherein the device includes a battery, the apparatus further comprising
   a circuit electrically coupled to the battery, wherein the circuit includes a processor, a memory, and an input device and an output device.

31. The apparatus of claim 1, wherein the circuit further includes an antenna.

32. The apparatus of claim 1, wherein the first physical-configuration layer is planarized before depositing the first barrier layer.

33. The apparatus of claim 32, wherein the layered barrier structure further includes a second physical-configuration layer covering the first barrier layer and a second barrier layer covering the second physical-configuration layer.

34. The apparatus of claim 33, wherein:
the first physical-configuration layer includes photoresist;
the first barrier layer includes aluminum;
the second physical-configuration layer includes photoresist; and
the second barrier layer includes aluminum.

35. The apparatus of claim 32, wherein the first physical-configuration layer is planarized using chemical-mechanical polishing (CMP) to form a plane across less than all of a surface of the first physical-configuration layer.

36. The apparatus of claim 1, wherein the first barrier layer is patterned into a spiral inductive coil.

37. The apparatus of claim 1, wherein the device includes a thin-film battery, and an opening is formed in the first physical-configuration layer and the first barrier layer makes electrical contact the device through the opening.

38. The apparatus of claim 1, wherein the device includes a thin-film battery, and the first physical-configuration layer is deposited using a doctor-blade process.

39. The apparatus of claim 1, wherein the device includes a thin-film battery, and the first physical-configuration layer is deposited as an ink in a printing process.

40. The apparatus of claim 1, wherein the layered barrier structure further includes a photodefined hole in the first physical-configuration layer, and wherein the first barrier layer makes electrical contact to the device through the hole.

41. An apparatus comprising:
a substrate;
a first device attached to the substrate; and
means for sealing the first device, including
means for physically configuring a surface of the device, the means for physically configuring the surface of the device made of a photodefinable material having a definable lateral extent that is photodefined after being deposited, and provides at least one of smoothing, planarizing and leveling physical configuration function, that is, and
means for blocking gas, deposited on the means for physically configuring the surface of the device.

42. The apparatus of claim 41, wherein the means for physically configuring the surface of the device has a lateral extent that is photodefined.

43. The apparatus of claim 41, wherein:
the means for sealing includes a layered barrier structure that seals the first device;
the means for physically configuring a surface of the device includes a first physical-configuration layer having a definable lateral extent, and
the means for blocking gas includes a first barrier layer.

44. The apparatus of claim 41, wherein the means for physically configuring the surface of the device includes an organic polymer.

45. The apparatus of claim 41, wherein the means for physically configuring the surface of the device includes glass.

46. The apparatus of claim 41, wherein the means for physically configuring the surface of the device includes a semi-solid layer.

47. The apparatus of claim 41, wherein a lateral extent of means for physically configuring the surface of the device is photodefined; wherein the first device attached to the substrate includes a deposited thin-film lithium battery having successive layers deposited on the substrate; and wherein the means for physically configuring the surface of the device is photodefined to cover at least the battery.

48. The apparatus of claim 41, wherein the means for blocking gas includes a metal.

49. The apparatus of claim 41, wherein the means for blocking gas includes aluminum.

50. The apparatus of claim 41, wherein the means for blocking gas includes a ceramic material.

51. A method comprising:
providing a substrate having a first device attached to the substrate; and
forming a first layered barrier structure that seals the first device, wherein the forming of the layered barrier structure includes
depositing a first physical-configuration layer made of a photodefinable material having a definable lateral extent, wherein the first physical-configuration layer provides at least one of a smoothing, planarizing, and leveling physical-configuration function, photodefining the first physical-configuration layer after it is deposited, and depositing a first barrier layer on the first physical-configuration layer.

52. The method of claim 51, further comprising:
photodefining a lateral extent of the first physical-configuration layer.

53. The method of claim 51, wherein the depositing of the first physical-configuration layer includes depositing photoresist and the depositing of the first barrier layer includes depositing aluminum.

54. The method of claim 51, wherein the depositing of the first physical-configuration layer includes depositing an organic polymer.

55. The method of claim 51, wherein the depositing of the first physical-configuration layer includes depositing glass.

56. The method of claim 51, wherein the depositing of the first physical-configuration layer includes depositing a semi-solid layer.

57. The method of claim 51, further comprising:
photodefining a lateral extent of the first physical-configuration layer; wherein the providing of the substrate having the first device attached to the substrate further includes depositing a thin-film lithium battery in successive layers on the substrate; and wherein the first physical-configuration layer is photodefined to cover at least the battery.

58. The method of claim 51, wherein the depositing of the first barrier layer includes depositing a metal.

59. The method of claim 51, wherein the depositing of the first barrier layer includes depositing aluminum.

60. The method of claim 51, wherein the depositing of the first barrier layer includes depositing a ceramic material.

61. The method of claim 51, wherein the forming of the first layered barrier structure also includes defining a lateral extent of the first barrier layer.

62. The method of claim 61, wherein the providing of the substrate having the first device attached to the substrate further includes depositing a thin-film lithium battery in successive layers on the substrate, and wherein the depositing of the first barrier layer includes depositing a gas barrier layer that is laterally limited but covers at least the battery.

63. The method of claim 51, further comprising photodefining the first barrier layer.

64. The method of claim 63, wherein the photodefining of the first barrier layer includes photodefining a circuit-wiring function.

65. The method of claim 51, wherein depositing of the barrier layer includes depositing a material having a gas-transmission rate of less than 0.1 ml gas per square meter per day.

66. The method of claim 51, wherein the forming of the first layered barrier structure further includes depositing a second physical-configuration layer on the first barrier layer and depositing a second barrier layer on the second physical-configuration layer.

67. The method of claim 66, wherein
the depositing of the first physical-configuration layer includes depositing photoresist;
the depositing of the first barrier layer includes depositing aluminum;
the depositing of the second physical-configuration layer includes depositing photoresist; and
the depositing of the second barrier layer includes depositing aluminum.

68. The method of claim 67, further comprising photodefining a lateral extent of the second physical-configuration layer.

69. The method of claim 67, further comprising connecting the first barrier layer and the second barrier layer to form a capacitor connected to a circuit.

70. The method of claim 56, further comprising depositing a plurality of alternating physical-configuration layers and barrier layers, and defining lateral extents of the alternating physical-configuration layers and barrier layers.

71. The method of claim 70, further comprising electrically connecting the plurality of defined alternating layers to an electrical circuit that includes a lithium battery, and wherein the forming of the first layered barrier structure includes sealing the lithium battery.

72. The method of claim 70, wherein the depositing of the plurality of defined alternating layers includes connecting the plurality of defined alternating layers to form a passive component of an electrical circuit, and wherein the device also forms a portion of the electrical circuit.

73. The method of claim 71, further comprising:
attaching a second device to the substrate;
covering the second device with the first layered barrier structure; and
connecting a plurality of defined alternating layers of the first layered barrier structure to form a passive component of an electrical circuit, and connecting the first and second devices to form portions of the electrical circuit.

74. The method of claim 71, wherein the depositing of the first physical-configuration layer includes depositing photoresist.

75. The method of claim 74, wherein the device includes a thin-film lithium battery, and further comprising laterally limiting the first physical-configuration photoresist layer using photolithography to cover at least the battery.

76. The method of claim 75, further comprising configuring the first barrier layer to form a circuit-wiring layer.

77. The method of claim 74, wherein the depositing of first barrier layer includes depositing metal on the first physical-configuration photoresist layer.

* * * * *